United States Patent
Ikeno et al.

(10) Patent No.: US 11,605,643 B2
(45) Date of Patent: Mar. 14, 2023

(54) SEMICONDUCTOR MEMORY DEVICE AND MANUFACTURING METHOD THEREOF

(71) Applicant: Kioxia Corporation, Tokyo (JP)

(72) Inventors: Daisuke Ikeno, Yokkaichi (JP); Akihiro Kajita, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 45 days.

(21) Appl. No.: 17/197,241

(22) Filed: Mar. 10, 2021

(65) Prior Publication Data
US 2022/0085051 A1 Mar. 17, 2022

(30) Foreign Application Priority Data
Sep. 17, 2020 (JP) .............................. JP2020-156745

(51) Int. Cl.
*H01L 27/11578* (2017.01)
*H01L 29/66* (2006.01)
(Continued)

(52) U.S. Cl.
CPC .... *H01L 27/11578* (2013.01); *H01L 27/1157* (2013.01); *H01L 27/11519* (2013.01);
(Continued)

(58) Field of Classification Search
CPC ......... H01L 27/11578; H01L 27/11519; H01L 27/11524; H01L 27/11551;
(Continued)

(56) References Cited

U.S. PATENT DOCUMENTS 9,019,739 B2 4/2015 Park et al.
2017/0018565 A1* 1/2017 Nishida ............... H01L 27/1157
(Continued)

FOREIGN PATENT DOCUMENTS

JP 2012-094694 A 5/2012
JP 2013-110193 A 6/2013
(Continued)

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

A semiconductor memory device according to an embodiment includes a semiconductor substrate, a first insulating layer, a second insulating layer, the first insulating layer between the semiconductor substrate and the second insulating layer, a semiconductor layer between the first insulating layer and the second insulating layer, the semiconductor layer extending in a first direction parallel to a surface of the semiconductor substrate, a gate electrode layer extending in a direction perpendicular to the surface; a first insulating film between the semiconductor layer and the gate electrode layer, a second insulating film between the first insulating film and the gate electrode layer the second insulating film in contact with the first insulating layer and the second insulating layer, a polycrystalline silicon region between the first insulating film and the second insulating film; and a metal film between the polycrystalline silicon region and the second insulating film containing titanium and silicon.

14 Claims, 25 Drawing Sheets

(51) Int. Cl.
  *H01L 27/1157* (2017.01)
  *H01L 27/11519* (2017.01)
  *H01L 27/11551* (2017.01)
  *H01L 27/11524* (2017.01)
  *H01L 27/11565* (2017.01)

(52) U.S. Cl.
  CPC .. *H01L 27/11524* (2013.01); *H01L 27/11551* (2013.01); *H01L 27/11565* (2013.01)

(58) Field of Classification Search
  CPC ........... H01L 27/11565; H01L 27/1157; H01L 29/40114; H01L 29/66825; H01L 29/7883
  See application file for complete search history.

(56) References Cited

U.S. PATENT DOCUMENTS

| | | | | |
|---|---|---|---|---|
| 2018/0323213 A1* | 11/2018 | Arai | ........................ | G11C 16/14 |
| 2020/0176033 A1* | 6/2020 | Hosotani | ............ | G11C 16/0483 |
| 2021/0118906 A1* | 4/2021 | Sawa | ................ | H01L 27/11556 |

FOREIGN PATENT DOCUMENTS

| | | | |
|---|---|---|---|
| JP | 2014-135493 A | 7/2014 |
| JP | 2020-092141 A | 6/2020 |

* cited by examiner

US 11,605,643 B2

SEMICONDUCTOR MEMORY DEVICE AND MANUFACTURING METHOD THEREOF

CROSS-REFERENCE TO RELATED APPLICATION

This application is based upon and claims the benefit of priority from Japanese Patent Application No. 2020-156745, filed on Sep. 17, 2020, the entire contents of which are incorporated herein by reference.

FIELD

Embodiments described herein relate generally to a semiconductor memory device and a manufacturing method thereof.

BACKGROUND

A three-dimensional NAND flash memory with memory cells disposed three-dimensionally achieves a high integration degree and a low cost. Scaling down the memory cells of the 3D NAND flash memory enables further enhancement in integration degree.

The scaling-down of memory cells reduces a possible amount of charges accumulated in one memory cell. For example, in order to enhance read-out characteristics and charge retention characteristics of memory cells, it is desired to increase the possible amount of charges accumulated in one memory cell.

DETAILED DESCRIPTION

Figure 1:
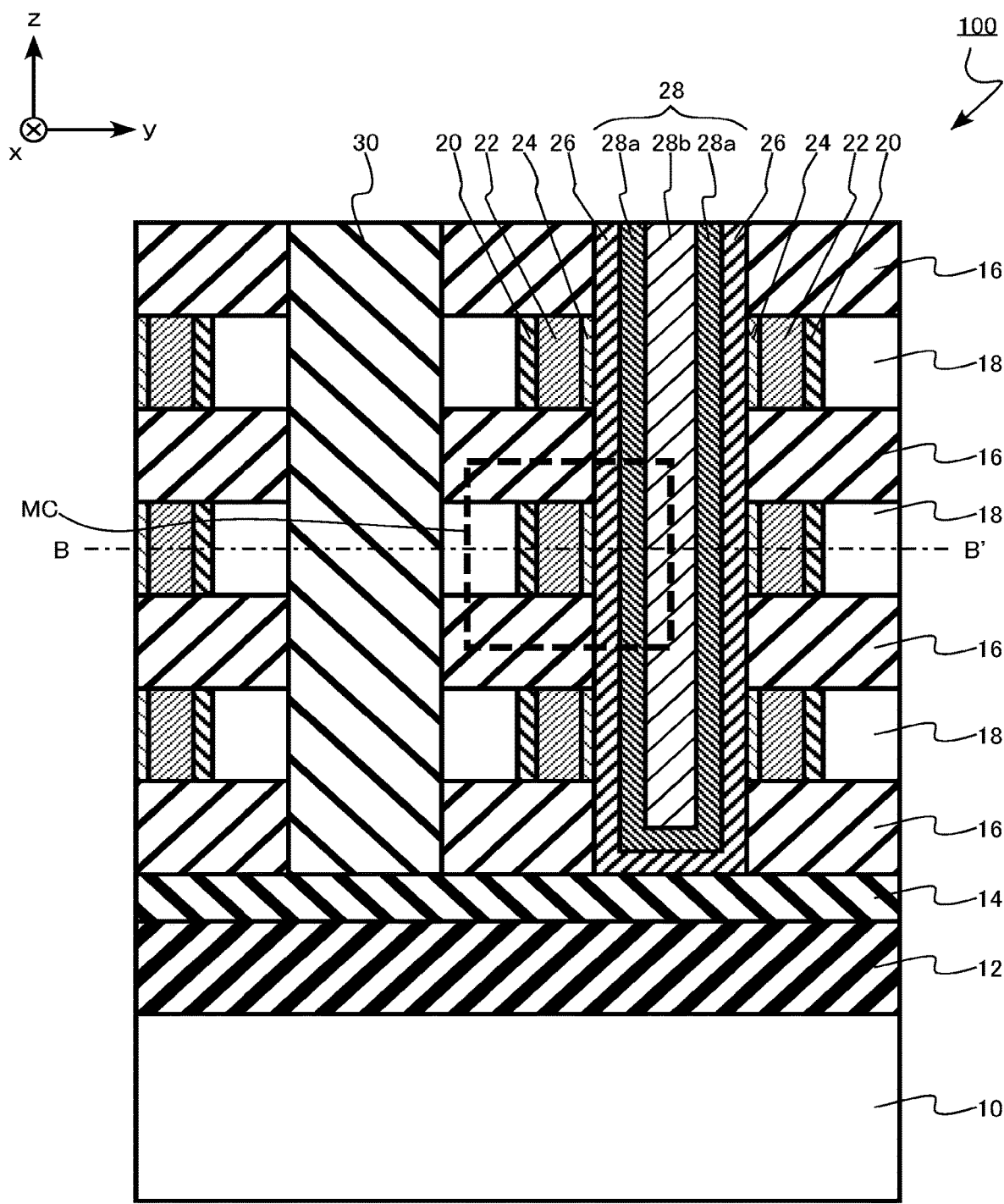
FIG. 1 is a schematic cross-sectional view of a semiconductor memory device according to a first embodiment.

A semiconductor memory device according to an embodiment includes: a semiconductor substrate; a first insulating layer; a second insulating layer, the first insulating layer between the semiconductor substrate and the second insulating layer; a semiconductor layer provided between the first insulating layer and the second insulating layer, the semiconductor layer extending in a first direction parallel to a surface of the semiconductor substrate; a gate electrode layer extending in a direction perpendicular to the surface; a first insulating film provided between the semiconductor layer and the gate electrode layer; a second insulating film provided between the first insulating film and the gate electrode layer, between the first insulating layer and the gate electrode layer, and between the second insulating layer and the gate electrode layer, the second insulating film being in contact with the first insulating layer and the second insulating layer; a polycrystalline silicon region provided between the first insulating film and the second insulating film; and a metal film provided between the polycrystalline silicon region and the second insulating film, the metal film containing titanium (Ti) and silicon (Si).

Hereinafter, embodiments of this disclosure will be described with reference to the drawings. In the following description, the same or similar members will be denoted with the same reference numerals, and the description of those members once described will be omitted as appropriate.

Furthermore, this specification uses the terms "on" and "under" for convenience sake. The terms "on" and "under" indicate, for example, relative positions in the drawings. The terms "on" and "under" do not necessarily define the positional relation with respect to gravity.

Chemical compositions of members included in the semiconductor memory device in this specification are qualitatively and quantitatively analyzed by, for example, secondary ion mass spectrometry (SIMS) and energy dispersive X-ray spectroscopy (EDX). Furthermore, a transmission electron microscope (TEM) may be employed in measuring thicknesses of members included in the semiconductor memory device or distances between the members.

In this specification, the "metal film" is a concept including not only a single metal film but also a film containing a metal element and having metallic properties such as a metallic compound film. Examples of the "metal film" include a metal silicide film and a metal nitride film.

First Embodiment

A semiconductor memory device according to a first embodiment includes: a semiconductor substrate; a first insulating layer; a second insulating layer, the first insulating layer between the semiconductor substrate and the second insulating layer; a semiconductor layer provided between the first insulating layer and the second insulating layer, the semiconductor layer extending in a first direction parallel to a surface of the semiconductor substrate; a gate electrode layer extending in a direction perpendicular to the surface; a first insulating film provided between the semiconductor layer and the gate electrode layer; a second insulating film provided between the first insulating film and the gate electrode layer, between the first insulating layer and the gate electrode layer, and between the second insulating layer and the gate electrode layer, the second insulating film being in contact with the first insulating layer and the second insulating layer; a polycrystalline silicon region provided between the first insulating film and the second insulating film; and a metal film provided between the polycrystalline silicon region and the second insulating film.

The semiconductor memory device according to the first embodiment is a three-dimensional NAND flash memory. The semiconductor memory device according to the first embodiment includes a plurality of semiconductor layers extending in the direction parallel to the surface of the semiconductor substrate, and the semiconductor layers are stacked on the semiconductor substrate with the insulating layers interposed therebetween. Memory cells are formed at intersections of the semiconductor layers and the gate electrode layer extending in the direction perpendicular to the surface of the semiconductor substrate. Each memory cell of the semiconductor memory device according to the first embodiment is what is called a floating gate memory cell.

Figure 2:
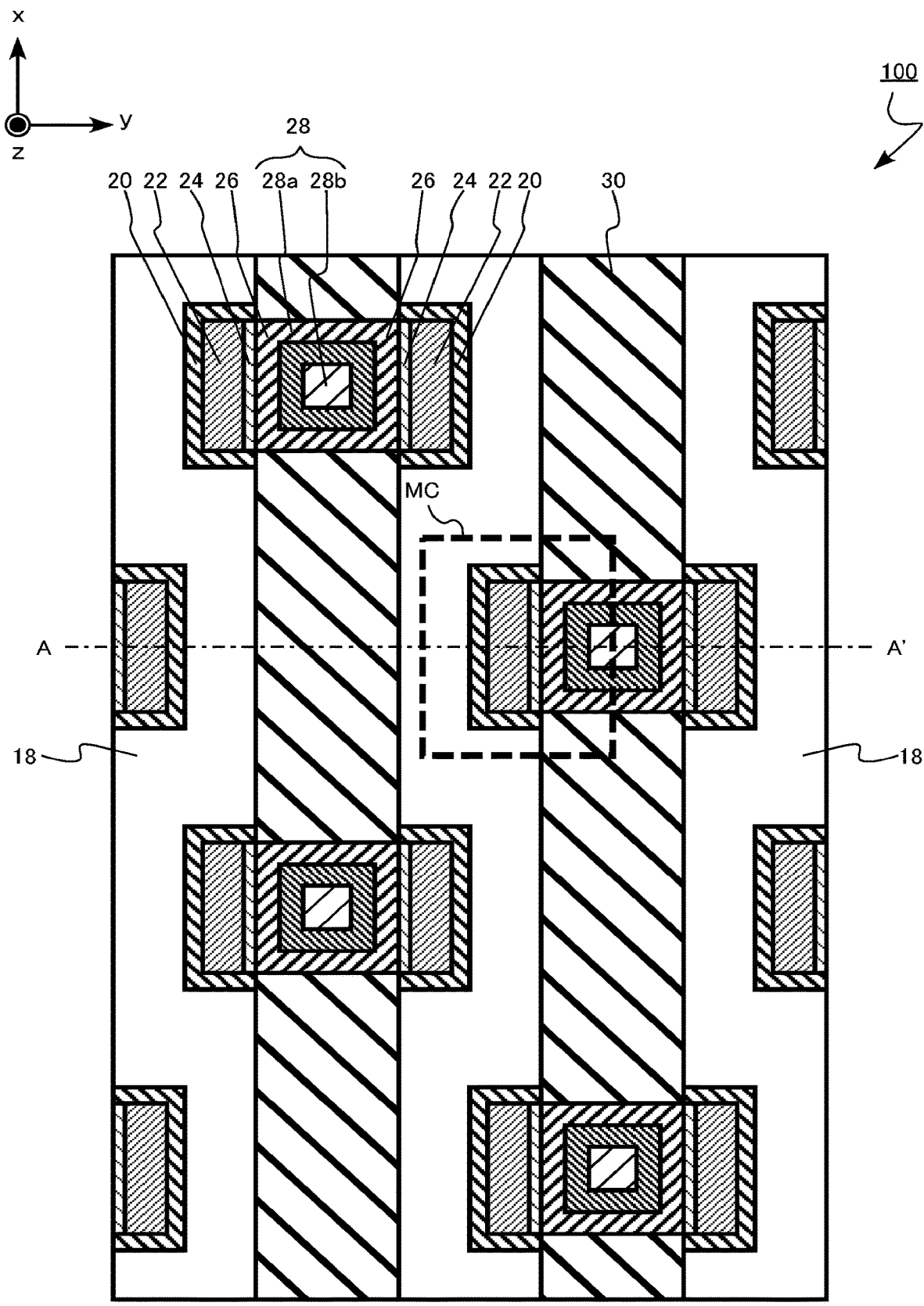
FIG. 2 is a schematic cross-sectional view of the semiconductor memory device according to the first embodiment.

FIGS. 1 and 2 are schematic cross-sectional views of the semiconductor memory device according to the first embodiment. FIGS. 1 and 2 are cross-sectional views illustrating a memory cell array of a flash memory 100 according to the first embodiment.

The flash memory 100 includes, for example, a peripheral circuit not illustrated in the drawings. The peripheral circuit includes, for example, a CMOS circuit and has a function of controlling operations of the memory cell array.

FIG. 1 is a cross section taken along line A-A' in FIG. 2. FIG. 2 is a cross section taken along line B-B' in FIG. 1. An area surrounded by dashed lines in each of FIGS. 1 and 2 corresponds to a memory cell MC.

FIG. 1 is a yz cross section of the memory cell array. FIG. 2 is an xy cross section of the memory cell array. Hereinafter, x direction is described as an example of the first direction. Y direction is described as an example of a second direction.

The flash memory 100 includes a semiconductor substrate 10, a substrate insulating layer 12, a stopper insulating layer 14, interlayer insulating layers 16, channel layers 18, tunnel insulating films 20, polycrystalline silicon regions 22, metal films 24, block insulating films 26, gate electrode layers 28, and trench insulating layers 30. Each gate electrode layer 28 includes a barrier metal layer 28a and a metal layer 28b.

The interlayer insulating layers 16 are examples of the first insulating layer and the second insulating layer. Each channel layer 18 is an example of the semiconductor layer. Each tunnel insulating film 20 is an example of the first insulating film. Each block insulating film 26 is an example of the second insulating film.

The semiconductor substrate 10 is, for example, single crystal silicon. The semiconductor substrate 10 is, for example, a silicon substrate. The semiconductor substrate 10 has surfaces parallel to x and y directions. A direction perpendicular to the surfaces of the semiconductor substrate 10 is z direction.

The substrate insulating layer 12 is provided on the semiconductor substrate 10. The substrate insulating layer 12 includes, for example, silicon oxide. The substrate insulating layer 12 is, for example, a silicon oxide layer.

The stopper insulating layer 14 is provided on the substrate insulating layer 12. The stopper insulating layer 14 includes, for example, silicon nitride. The stopper insulating layer 14 is, for example, a silicon nitride layer. The stopper insulating layer 14 functions as, for example, an etching stopper at the time of forming a memory trench or a memory hole on the stopper insulating layer 14.

The interlayer insulating layers 16 and the channel layers 18 are alternately stacked on the stopper insulating layer 14. Although FIG. 1 illustrates a structure with four interlayer insulating layers 16 and three channel layers 18, the number of interlayer insulating layers 16 may be four or more and the number of channel layers 18 may be three or more.

Each interlayer insulating layer 16 is provided between two adjacent channel layers 18. Each interlayer insulating layer 16 electrically separates two adjacent channel layers 18.

The interlayer insulating layers 16 include, for example, an oxide, an oxynitride, or a nitride. For example, silicon oxide is included in the interlayer insulating layers 16. The interlayer insulating layers 16 have a thickness in z direction of, for example, 5 nm or more and 30 nm or less.

Each channel layer 18 is provided between interlayer insulating layers 16. The channel layers 18 extend in x direction. Each channel layer 18 functions as a channel of the transistor of each memory cell MC.

The channel layers 18 are, for example, polycrystalline semiconductors. For example, polycrystalline silicon is included in the channel layers 18. The channel layers 18 are, for example, polycrystalline silicon layers. The channel layers 18 have a thickness in z direction of, for example, 5 nm or more and 30 nm or less.

Each gate electrode layer 28 extends in z direction. Adjacent gate electrode layers 28 are electrically separated by each interlayer insulating layer 16 or each trench insulating layer 30. Each gate electrode layer 28 functions as a gate electrode of the transistor of each memory cell MC.

The gate electrode layers 28 are columnar conductors. Each gate electrode layer 28 includes, for example, the barrier metal layer 28a and the metal layer 28b. Each barrier metal layer 28a is provided between each block insulating film 26 and each metal layer 28b. Each barrier metal layer 28a surrounds each metal layer 28b.

The barrier metal layers 28a include, for example, a metal nitride or a metal carbide. For example, titanium nitride is included in the barrier metal layers 28a. The barrier metal layers 28a are, for example, titanium nitride layers.

The metal layers 28b include, for example, a metal. For example, tungsten (W) is included in the metal layers 28b. The metal layers 28b are, for example, tungsten layers.

Each trench insulating layer 30 is provided between channel layers 18 adjacent to each other in y direction. Each trench insulating layer 30 is provided between gate electrode layers 28 adjacent to each other in x direction.

Each trench insulating layer 30 includes, for example, an oxide, an oxynitride, or a nitride. For example, silicon oxide is included in the trench insulating layers 30. The trench insulating layers 30 are, for example, silicon oxide layers.

Each tunnel insulating film 20 is provided between each channel layer 18 and each gate electrode layer 28. Each tunnel insulating film 20 is provided between each channel layer 18 and each polycrystalline silicon region 22. Each tunnel insulating film 20 is in contact with each channel layer 18.

The tunnel insulating films 20 have a function of passing electric charges according to voltages applied between the gate electrode layers 28 and the channel layers 18.

Each tunnel insulating film 20 includes, for example, silicon oxide, silicon nitride, or silicon oxynitride. The tunnel insulating films 20 are, for example, silicon oxide films. The tunnel insulating films 20 are, for example, thermal silicon oxide films.

Each polycrystalline silicon region 22 is provided between each tunnel insulating film 20 and each gate electrode layer 28. Each polycrystalline silicon region 22 is provided between each tunnel insulating film 20 and each block insulating film 26. Each polycrystalline silicon region 22 is provided between each tunnel insulating film 20 and each metal film 24. Each polycrystalline silicon region 22 is in contact with each tunnel insulating film 20.

The polycrystalline silicon regions 22 have a function of accumulating electric charges. The charges are, for example, electrons. A threshold voltage of the transistor of each memory cell varies according to an accumulation of charge in each polycrystalline silicon region 22. Using the variation in threshold voltage, each memory cell can store data. The more the accumulation of charge in each polycrystalline silicon region 22 increases, the larger the variation in threshold voltage.

For example, the variation in threshold voltage of the transistor of a memory cell changes a voltage at which the transistor of the memory cell turns on. For example, provided that a state with a high threshold voltage is defined as data "0" and a state with a low threshold voltage is defined as data "1," a memory cell can store 1-bit data of "0" and "1."

The polycrystalline silicon regions 22 include polycrystalline silicon.

Each metal film 24 is provided between each polycrystalline silicon region 22 and each gate electrode layer 28. Each metal film 24 is provided between each polycrystalline silicon region 22 and each block insulating film 26. Each metal film 24 is in contact with each polycrystalline silicon region 22.

The metal films 24 have a function of accumulating electric charges. Each polycrystalline silicon region 22 and each metal film 24 function as charge accumulation regions of each memory cell MC.

Each metal film 24 includes, for example, metal silicide. For example, titanium (Ti) and silicon (Si) are included in the metal films 24. The metal films 24 include, for example, titanium silicide. The metal films 24 are, for example, titanium silicide films.

Each metal film 24 includes, for example, titanium (Ti), silicon (Si) and nitrogen (N). For example, titanium silicide containing nitrogen (N) is included in the metal films 24. For example, nitrided titanium silicide is included in the metal films 24. The metal films 24 are, for example, nitrogen containing-titanium silicide films.

Each block insulating film 26 is provided between each tunnel insulating film 20 and each gate electrode layer 28. Each block insulating film 26 is provided between each metal film 24 and each gate electrode layer 28. Each block insulating film 26 is in contact with each metal film 24 and each gate electrode layer 28.

Each block insulating film 26 is provided between each gate electrode layer 28 and the interlayer insulating layer 16 on the upper side of each channel layer 18. Each block insulating film 26 is provided between each gate electrode layer 28 and the interlayer insulating layer 16 on the lower side of each channel layer 18.

Each block insulating film 26 is in contact with the interlayer insulating layer 16 on the upper side of each channel layer 18. Each block insulating film 26 is in contact with the interlayer insulating layer 16 on the lower side of each channel layer 18.

The interlayer insulating layer 16 on the upper side of each channel layer 18 is an example of the second insulating layer. The interlayer insulating layer 16 on the lower side of each channel layer 18 is an example of the first insulating layer.

The block insulating films 26 are continuously provided in z direction. Each block insulating film 26 is continuous between two memory cells MC adjacent to each other in z direction. Each block insulating film 26 surrounds each gate electrode layer 28.

The block insulating films 26 have a function of blocking currents flowing between the polycrystalline silicon regions 22, the metal films 24, and the gate electrode layers 28.

Each block insulating film 26 includes, for example, an oxide, an oxynitride, or a nitride. For example, silicon oxide is included in the block insulating films 26. The block insulating films 26 are, for example, silicon oxide films.

Each block insulating film 26 includes, for example, a high-dielectric material having a higher dielectric constant than silicon oxide. The block insulating films 26 are, for example, high-dielectric films. Each block insulating film 26 includes at least one metal element selected from the group consisting of, for example, hafnium (Hf), aluminum (Al), and zirconium (Zr). Each block insulating film 26 includes, for example, hafnium oxide, aluminum oxide, or zirconium oxide. Each block insulating film 26 is, for example, a hafnium oxide film, an aluminum oxide film, or a zirconium oxide film.

The block insulating films 26 may have, for example, a stacked structure of a silicon oxide film and a high-dielectric film.

Figure 3:
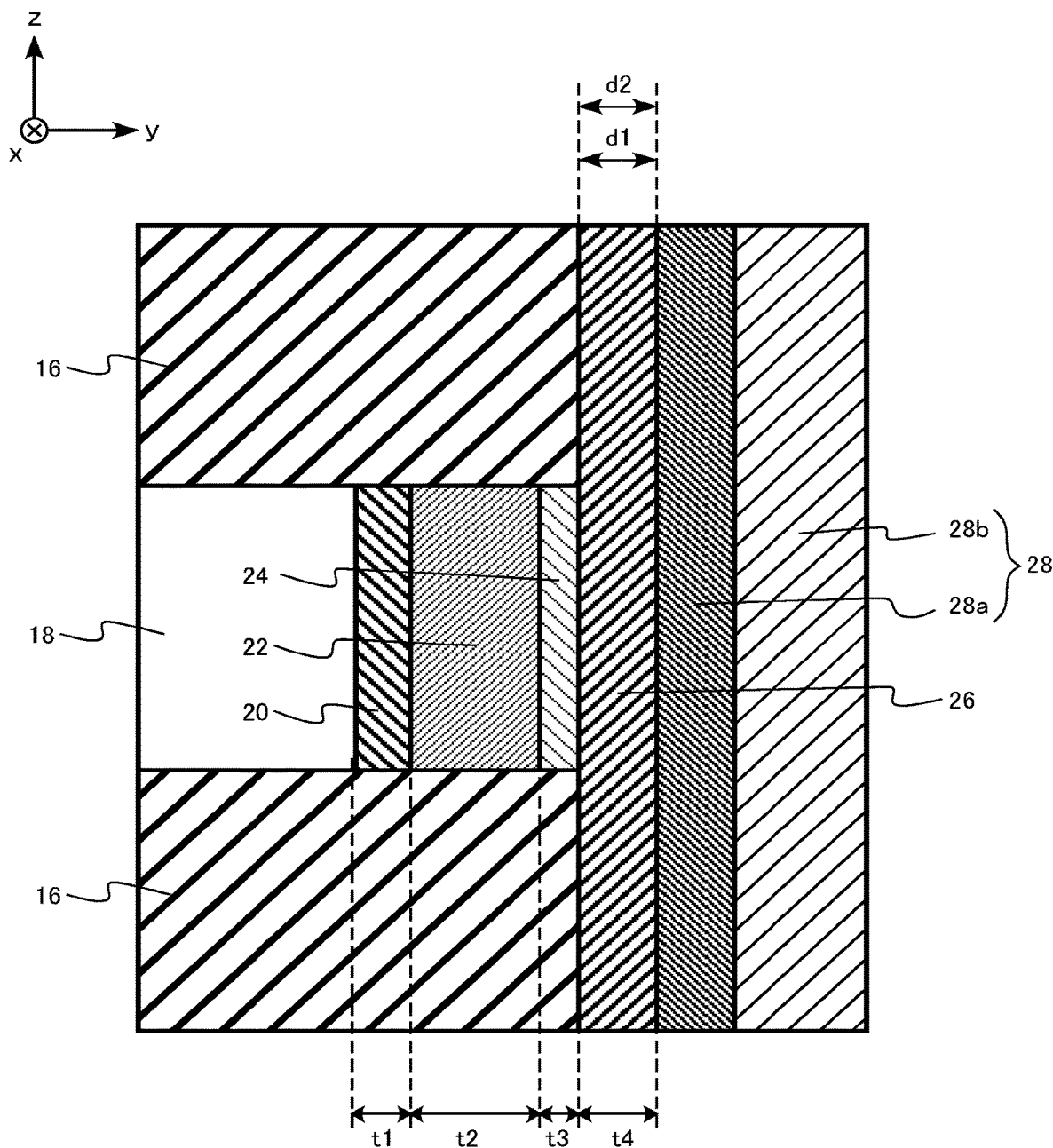
FIG. 3 is an enlarged schematic cross-sectional view of the semiconductor memory device according to the first embodiment.

FIG. 3 is an enlarged schematic cross-sectional view of the semiconductor memory device according to the first embodiment. FIG. 3 is a cross-sectional view of a memory cell MC. FIG. 3 is a yz cross section of the memory cell MC.

The tunnel insulating film 20 has a thickness in y direction (t1 in FIG. 3) of, for example, 3 nm or more and 8 nm or less. The polycrystalline silicon region 22 has a thickness in y direction (t2 in FIG. 3) of, for example, 5 nm or more and 15 nm or less. The metal film 24 has a thickness in y direction (t3 in FIG. 3) of, for example, 0.2 nm or more and 1 nm or less. The block insulating film 26 has a thickness in y direction (t4 in FIG. 3) of, for example, 5 nm or more and 15 nm or less.

The y-direction thickness t3 of the metal film 24 is thinner than, for example, the y-direction thickness t1 of the tunnel insulating film 20. In regard to a distance between the metal film 24 and the gate electrode layer 28 (d1 in FIG. 3) and a distance between the interlayer insulating layer 16 and the gate electrode layer 28 (d2 in FIG. 3), a difference between those distances is smaller than the y-direction thickness t1 of the tunnel insulating film 20. The difference between the distance d1 from the metal film 24 to the gate electrode layer 28 and the distance d2 from the interlayer insulating layer 16 to the gate electrode layer 28 is, for example, 3 nm or less.

Note that FIG. 3 illustrates a case where the distance d1 between the metal film 24 and the gate electrode layer 28 is equal to the distance d2 between the interlayer insulating layer 16 and the gate electrode layer 28.

Figure 4:
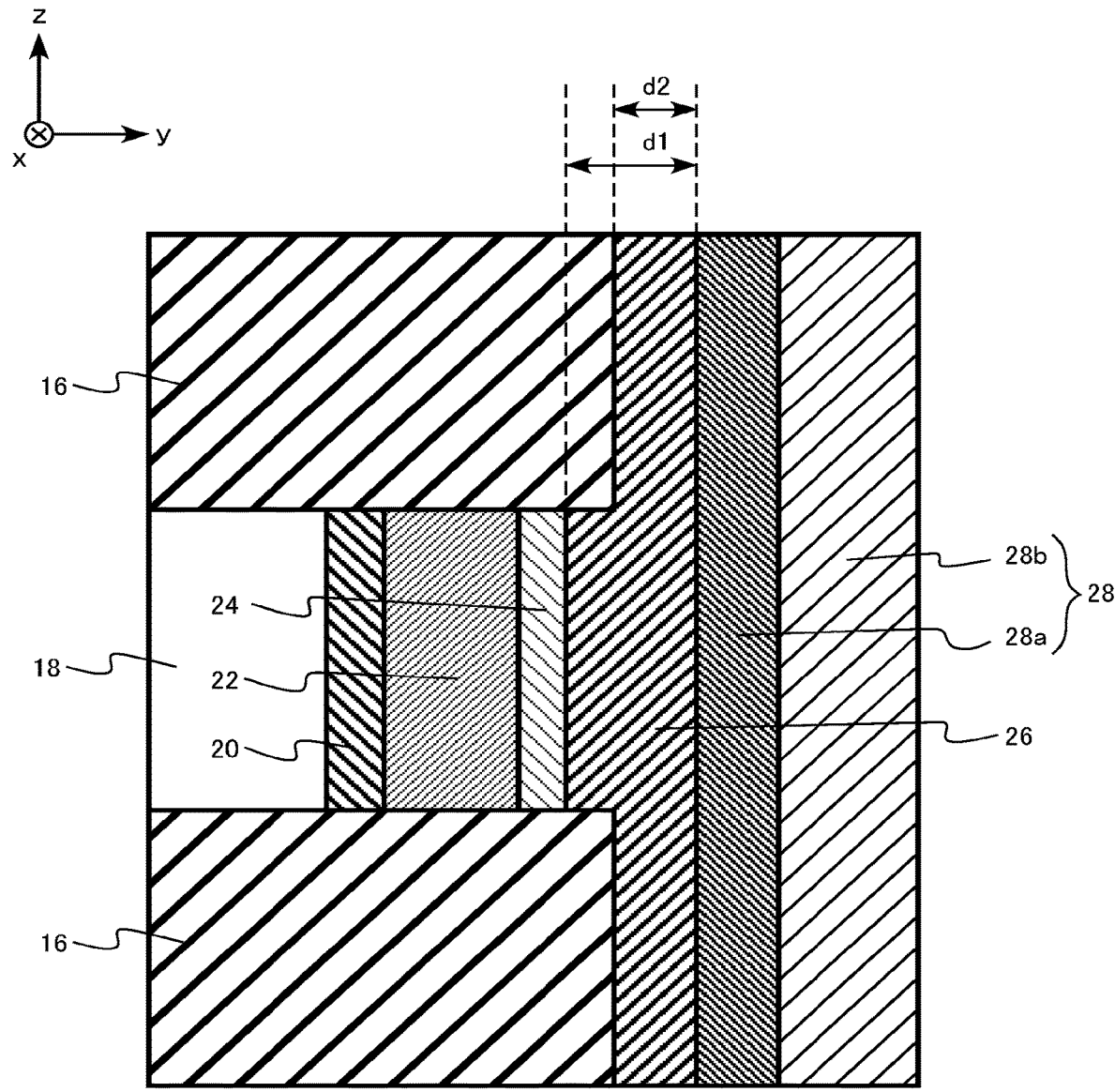
FIG. 4 is an enlarged schematic cross-sectional view of a first modification of the semiconductor memory device according to the first embodiment.

FIG. 4 is an enlarged schematic cross-sectional view of a first modification of the semiconductor memory device according to the first embodiment. FIG. 4 is a cross-sectional view of the memory cell MC. FIG. 4 is a yz cross section of the memory cell MC. FIG. 4 illustrates a case where the distance d1 between the metal film 24 and the gate electrode layer 28 is larger than the distance d2 between the interlayer insulating layer 16 and the gate electrode layer 28.

In FIG. 4, for example, the distance d1 between the metal film 24 and the gate electrode layer 28 is larger than that illustrated in FIG. 3. In other words, the block insulating film 26 between the metal film 24 and the gate electrode layer 28 in FIG. 4 has a larger thickness. This prevents leakage current between the metal film 24 and the gate electrode layer 28.

Figure 5:
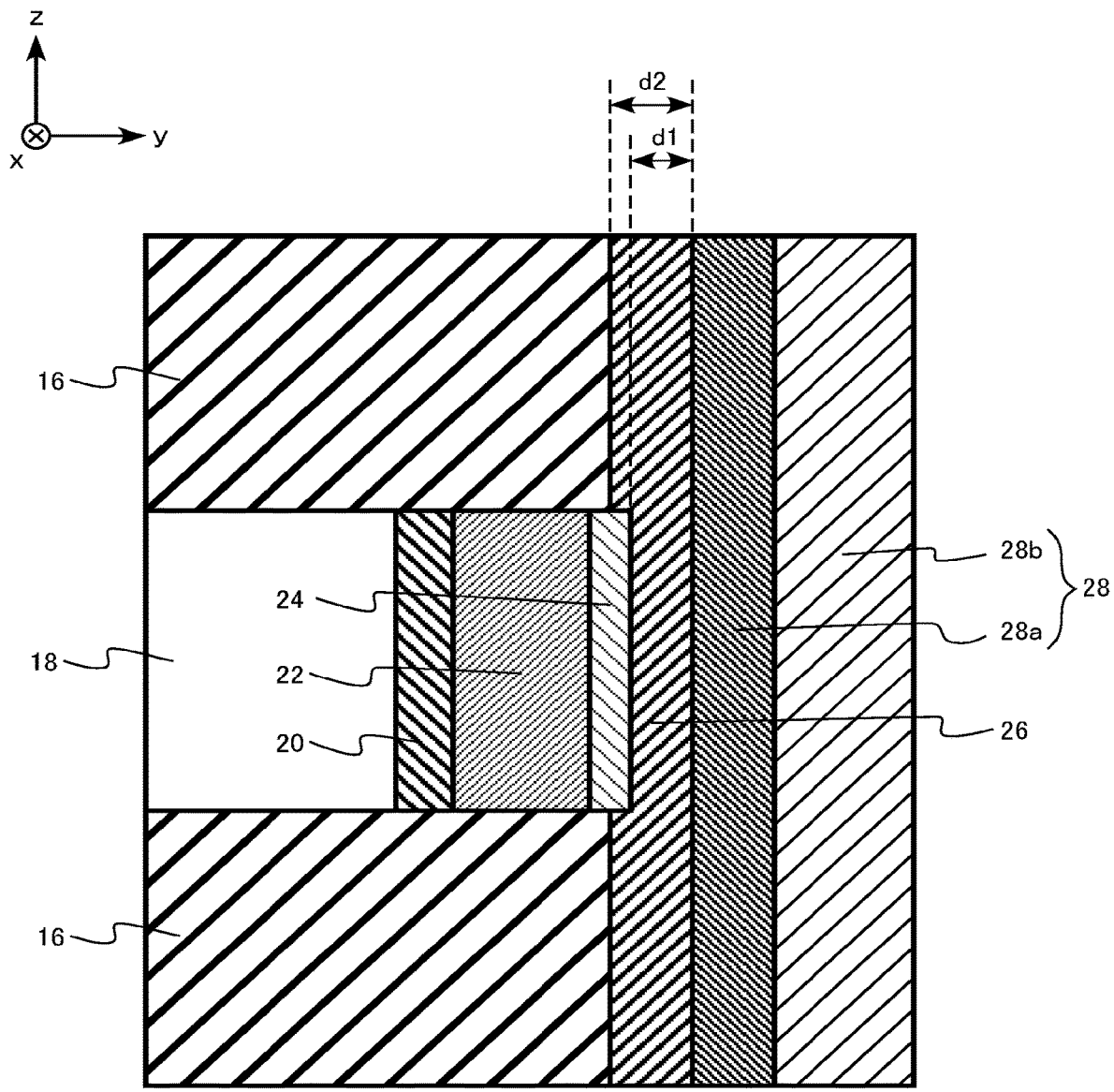
FIG. 5 is an enlarged schematic cross-sectional view of a second modification of the semiconductor memory device according to the first embodiment.

FIG. 5 is an enlarged schematic cross-sectional view of a second modification of the semiconductor memory device according to the first embodiment. FIG. 5 is a cross-sectional view of the memory cell MC. FIG. 5 is a yz cross section. FIG. 5 illustrates a case where the distance d1 between the metal film 24 and the gate electrode layer 28 is smaller than the distance d2 between the interlayer insulating layer 16 and the gate electrode layer 28.

In the case shown in FIG. 5, the metal film 24 projects toward the block insulating film 26, which increases, for example, the capacitance between the metal film 24 and the gate electrode layer 28 as compared with the case shown in FIG. 3. This increases, for example, an effective coupling ratio of the memory cell MC, which enhances write characteristics or erase characteristics of the memory cell MC.

Hereinafter described is an example of a method for manufacturing a semiconductor memory device according to the first embodiment.

The method for manufacturing a semiconductor memory device according to the first embodiment includes: forming a plurality of first insulating layers and a plurality of semiconductor layers alternately on a semiconductor substrate; forming a trench extending in a first direction parallel to a surface of the semiconductor substrate in the first insulating layers and the semiconductor layers; filling the trench with a second insulating layer; forming a hole extending in a direction perpendicular to the surface in the second insulating layer; forming a recess by etching a first semiconductor layer, the first semiconductor layer being one of the semiconductor layers exposed on an inner wall of the hole; forming a first insulating film on the first semiconductor layer in the recess; forming a polycrystalline silicon region on the first insulating film in the recess; forming a metal film selectively on the polycrystalline silicon region; forming a second insulating film on the metal film; and forming a gate electrode layer in the hole.

In the method for manufacturing a semiconductor memory device according to the first embodiment, forming a titanium film in the hole; forming a titanium silicide film by a reaction between the polycrystalline silicon region and a part of the titanium film; nitriding the titanium film to form a titanium nitride film; and removing the titanium nitride film selectively to the titanium silicide film. The forming of the metal film further includes nitriding the titanium silicide film after the removing of the titanium nitride film.

FIGS. 6, 7, 8, 9, 10, 11, 12, 13, 14, 15, 16, 17, and 18 are schematic cross-sectional views of the method for manufacturing a semiconductor memory device according to the first embodiment. FIGS. 6 to 18 each illustrate a cross section corresponding to FIG. 1. FIGS. 6 to 18 each illustrate an example of a method for manufacturing the memory cell array of the flash memory 100.

Figure 6:
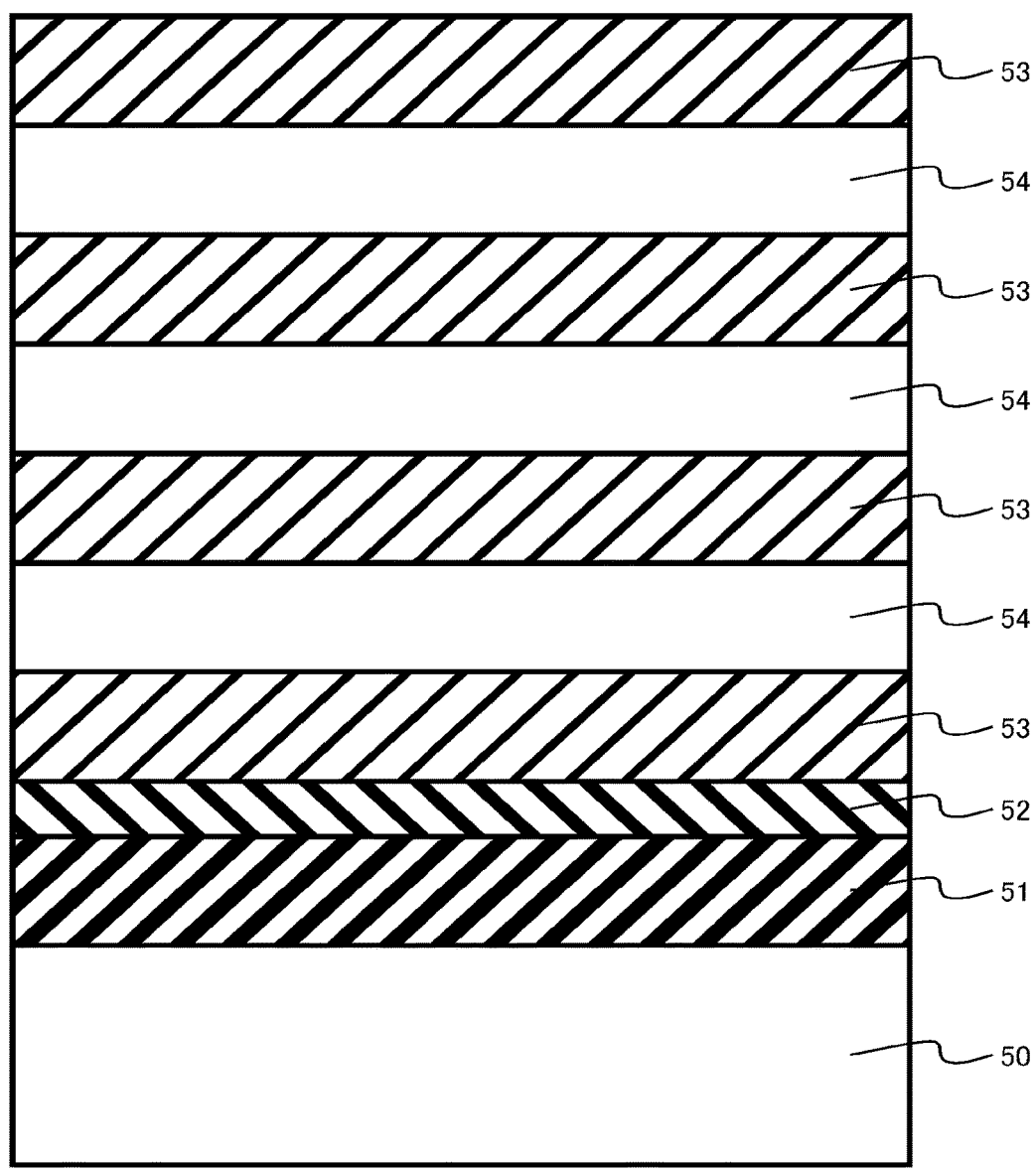
FIG. 6 is a schematic cross-sectional view of a method for manufacturing a semiconductor memory device according to the first embodiment.

First, a silicon oxide layer 51 and a silicon nitride layer 52 are formed on a silicon substrate 50. Next, a plurality of silicon oxide layers 53 and a plurality of polycrystalline silicon layers 54 are alternately stacked on the silicon nitride layer 52 (FIG. 6).

The silicon oxide layer 51, the silicon nitride layer 52, the silicon oxide layers 53, and the polycrystalline silicon layers 54 are formed by, for example, chemical vapor deposition (CVD).

The silicon substrate 50 is an example of the semiconductor substrate. Each of the silicon oxide layers 53 is an example of the first insulating layer. Each of the polycrystalline silicon layers 54 is an example of the semiconductor layer.

The silicon oxide layer 51 eventually becomes the substrate insulating layer 12. The silicon nitride layer 52 eventually becomes the stopper insulating layer 14. The silicon oxide layers 53 partially become the interlayer insulating layers 16 eventually. Furthermore, the polycrystalline silicon layers 54 partially become the channel layers 18 eventually.

Figure 7:
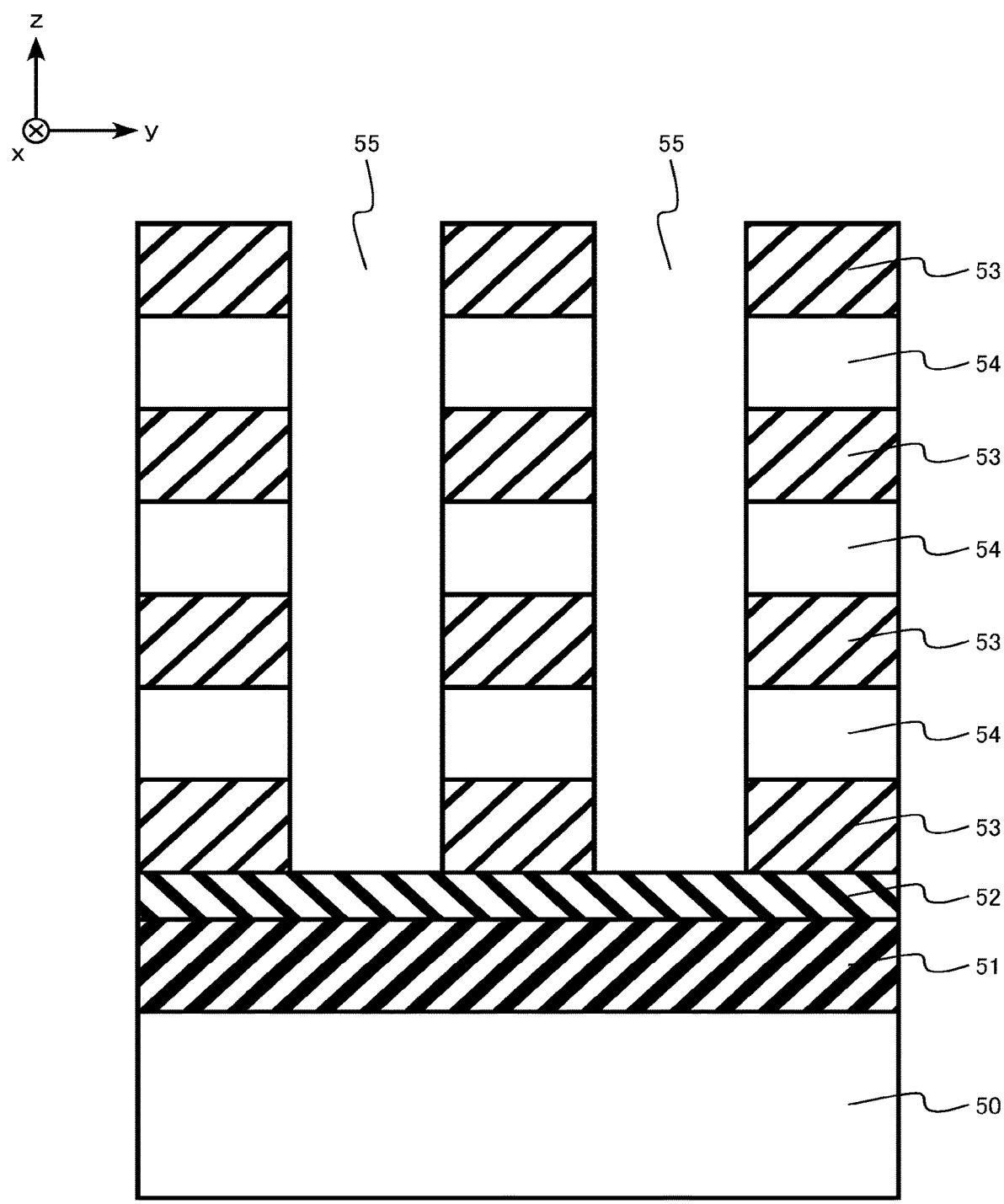
FIG. 7 is a schematic cross-sectional view of the method for manufacturing a semiconductor memory device according to the first embodiment.

Next, memory trenches 55 are formed in the plurality of silicon oxide layers 53 and the plurality of polycrystalline silicon layers 54 (FIG. 7). The memory trenches 55 penetrate the plurality of silicon oxide layers 53 and the plurality of polycrystalline silicon layers 54 and reach the silicon nitride layer 52. The memory trenches 55 extend in x direction.

The memory trenches 55 are formed by, for example, lithography and reactive ion etching (RIE). Each memory trench 55 is an example of the trench.

When the memory trenches 55 are formed by RIE, the silicon nitride layer 52 functions as an etching stopper.

Figure 8:
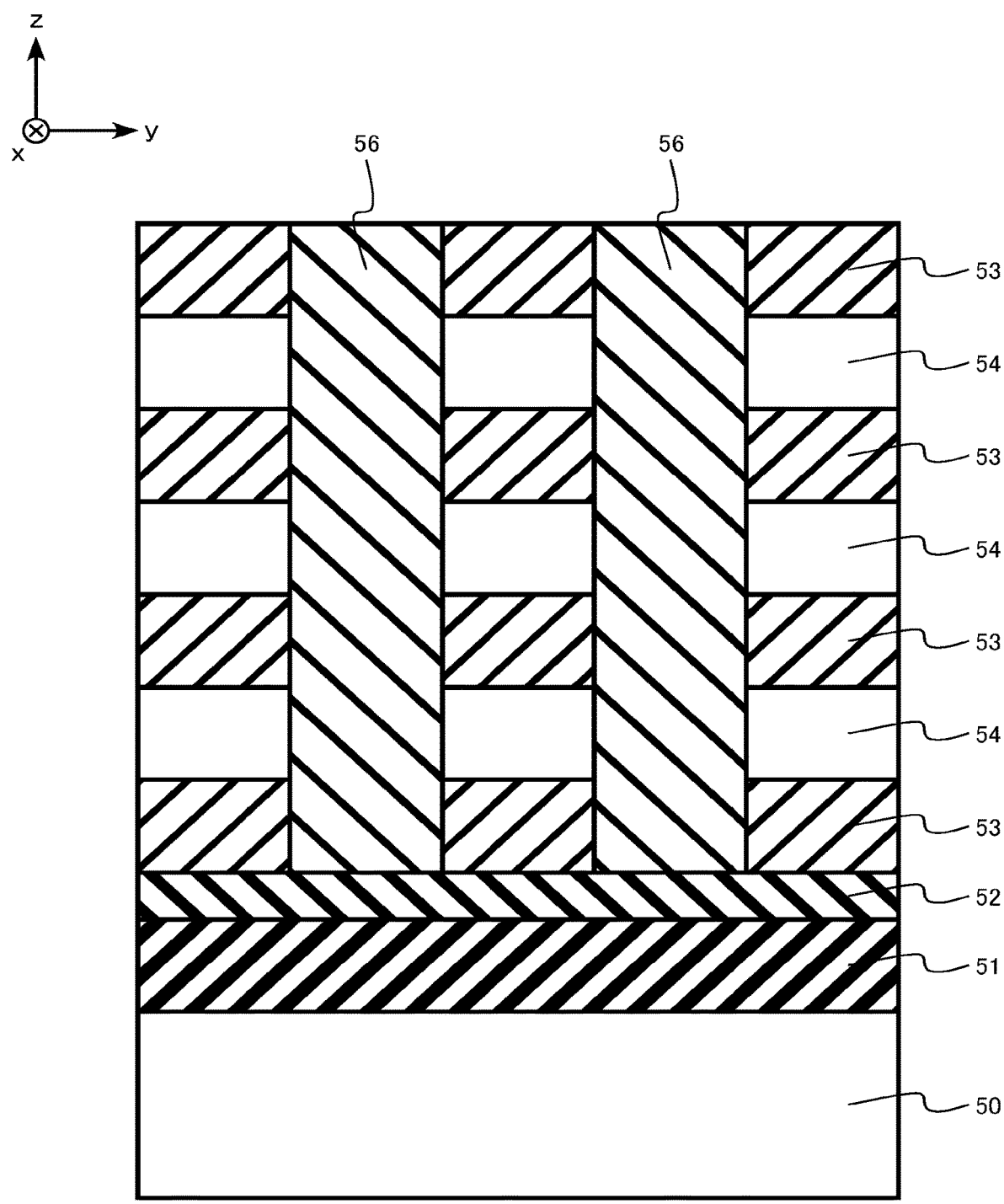
FIG. 8 is a schematic cross-sectional view of the method for manufacturing a semiconductor memory device according to the first embodiment.

Next, the inside of each memory trench 55 is embedded with a silicon oxide layer 56 (FIG. 8). The silicon oxide layers 56 are formed by, for example, CVD.

Each silicon oxide layer 56 is an example of the second insulating layer. The silicon oxide layers 56 eventually become the trench insulating layers 30.

Figure 9:
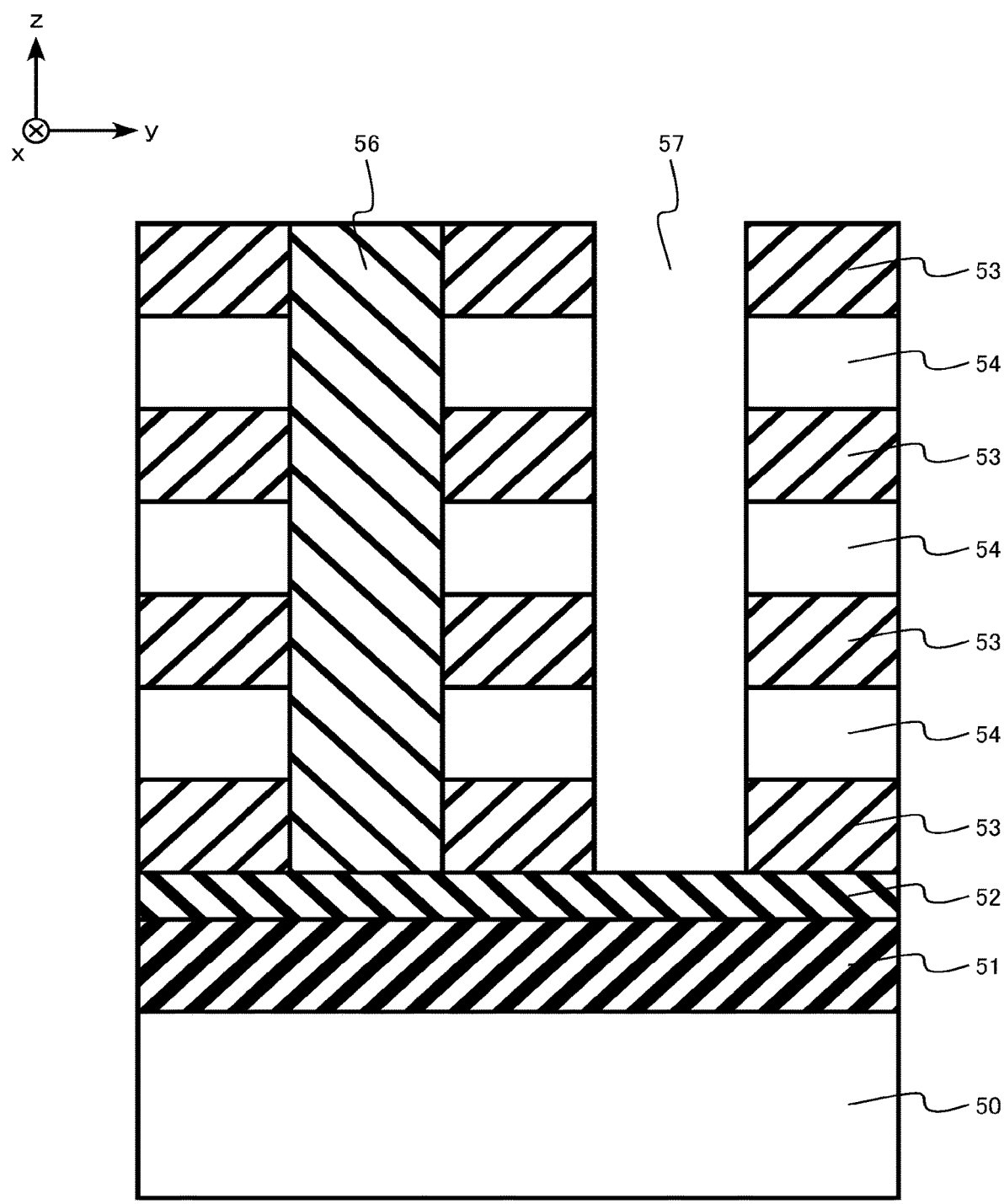
FIG. 9 is a schematic cross-sectional view of the method for manufacturing a semiconductor memory device according to the first embodiment.

Next, memory holes 57 are formed in some parts of the silicon oxide layers 56 (FIG. 9). The memory holes 57 reach the silicon nitride layer 52. The memory holes 57 extend in z direction.

The memory holes 57 are formed by, for example, lithography and RIE. Each memory hole 57 is an example of the hole.

Figure 10:
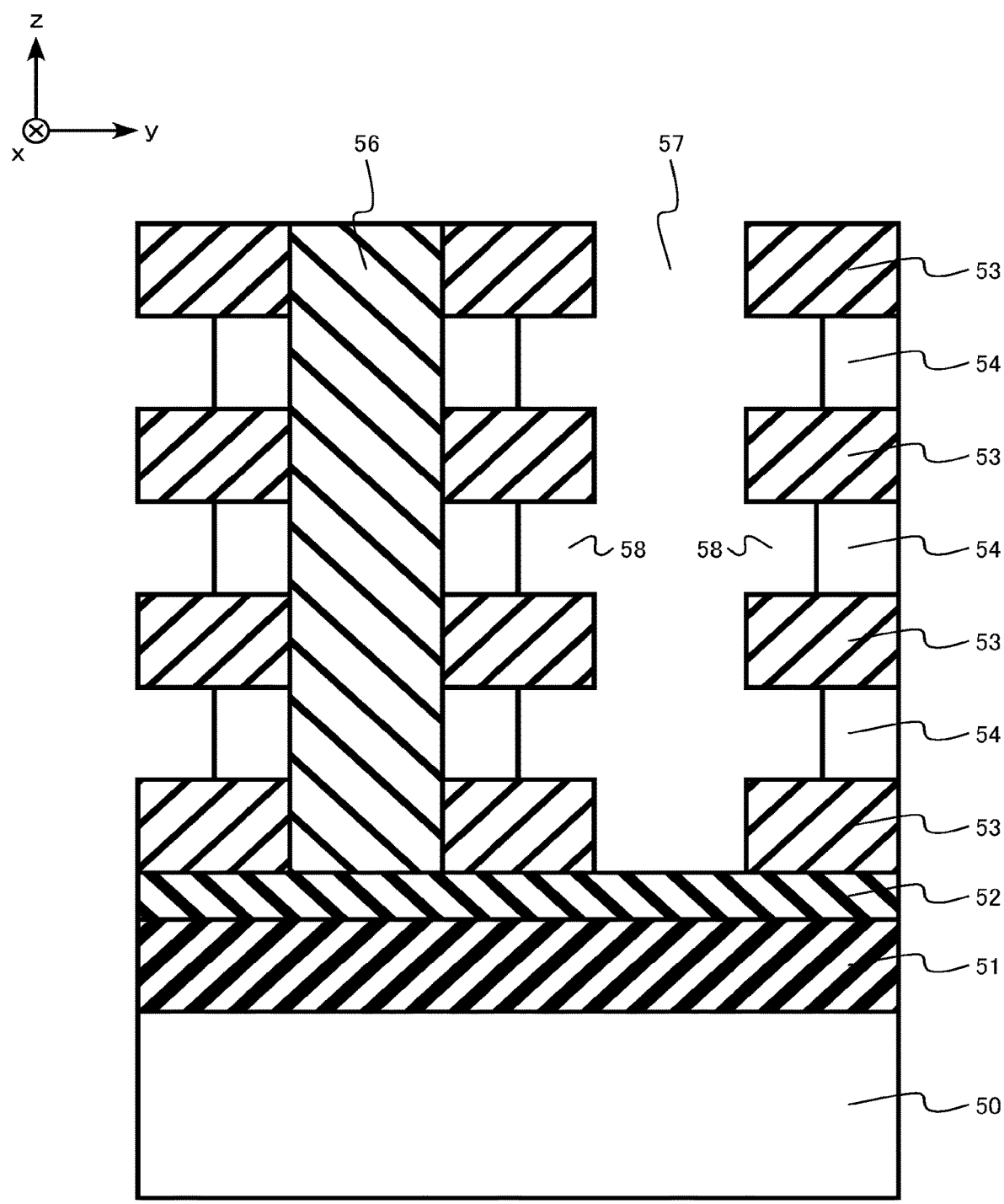
FIG. 10 is a schematic cross-sectional view of the method for manufacturing a semiconductor memory device according to the first embodiment.

Next, the polycrystalline silicon layers 54 exposed on the inner walls of the memory holes 57 are etched to form recesses 58 (FIG. 10). The polycrystalline silicon layers 54 are etched by, for example, wet etching. Each polycrystalline silicon layer 54 is an example of the first semiconductor layer.

Figure 11:
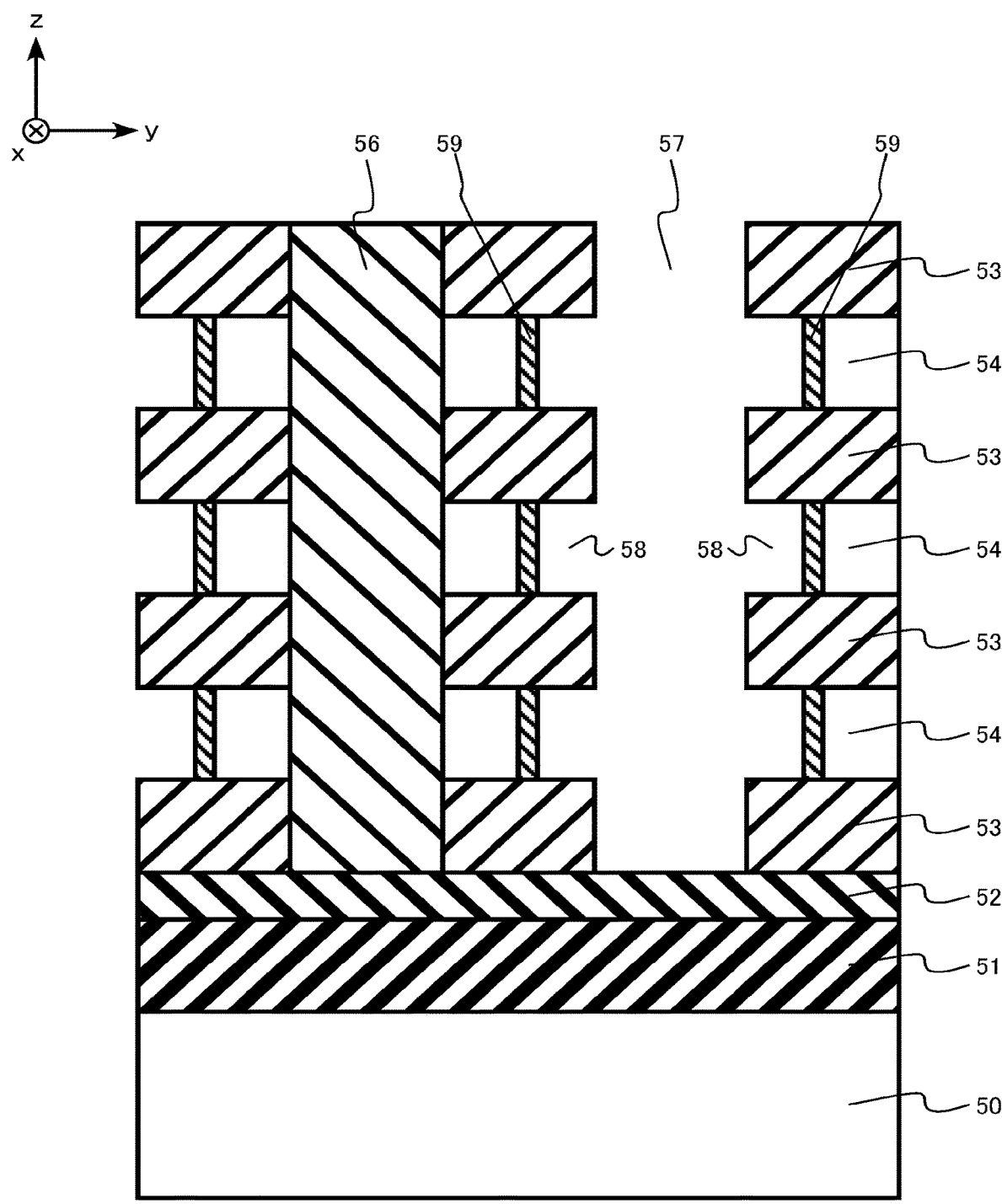
FIG. 11 is a schematic cross-sectional view of the method for manufacturing a semiconductor memory device according to the first embodiment.

Next, silicon oxide films 59 are formed on the polycrystalline silicon layers 54 in the recesses 58 (FIG. 11). The silicon oxide films 59 are formed, for example, by thermally oxidizing the polycrystalline silicon layers 54. Alternatively, the silicon oxide films 59 can be formed by CVD.

The silicon oxide films 59 have a thickness in y direction of, for example, 3 nm or more and 8 nm or less.

Each silicon oxide film 59 is an example of the first insulating film. The silicon oxide films 59 eventually become the tunnel insulating films 20.

Figure 12:
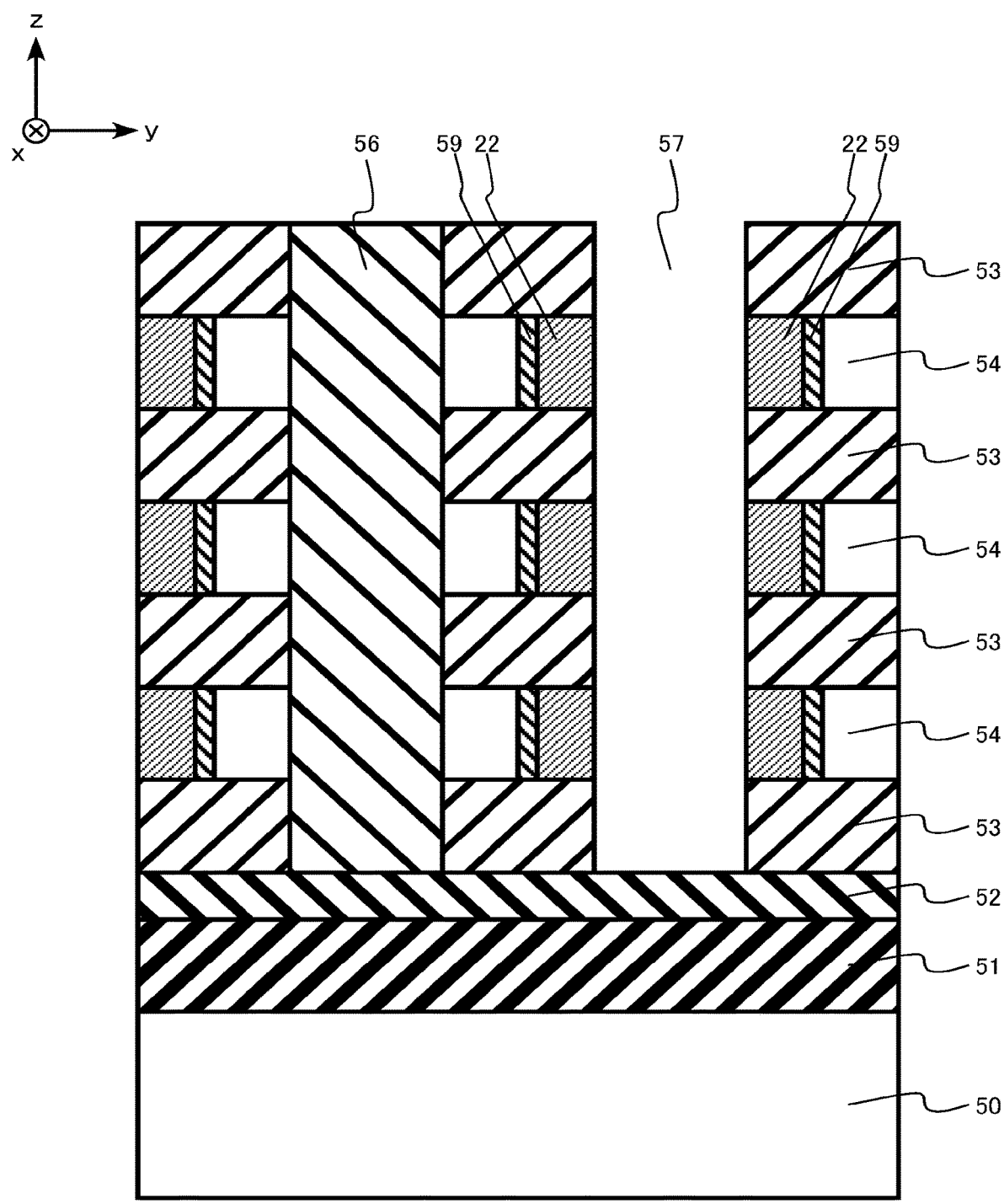
FIG. 12 is a schematic cross-sectional view of the method for manufacturing a semiconductor memory device according to the first embodiment.

Next, the polycrystalline silicon regions 22 are formed on the silicon oxide films 59 in the recesses 58 (FIG. 12). When forming the polycrystalline silicon regions 22, for example, polycrystalline silicon films are deposited by CVD. Then, the polycrystalline silicon films on the silicon oxide layers 53 are removed by wet etching.

The polycrystalline silicon regions 22 have a thickness in y direction of, for example, 5 nm or more and 15 nm or less.

Figure 13:
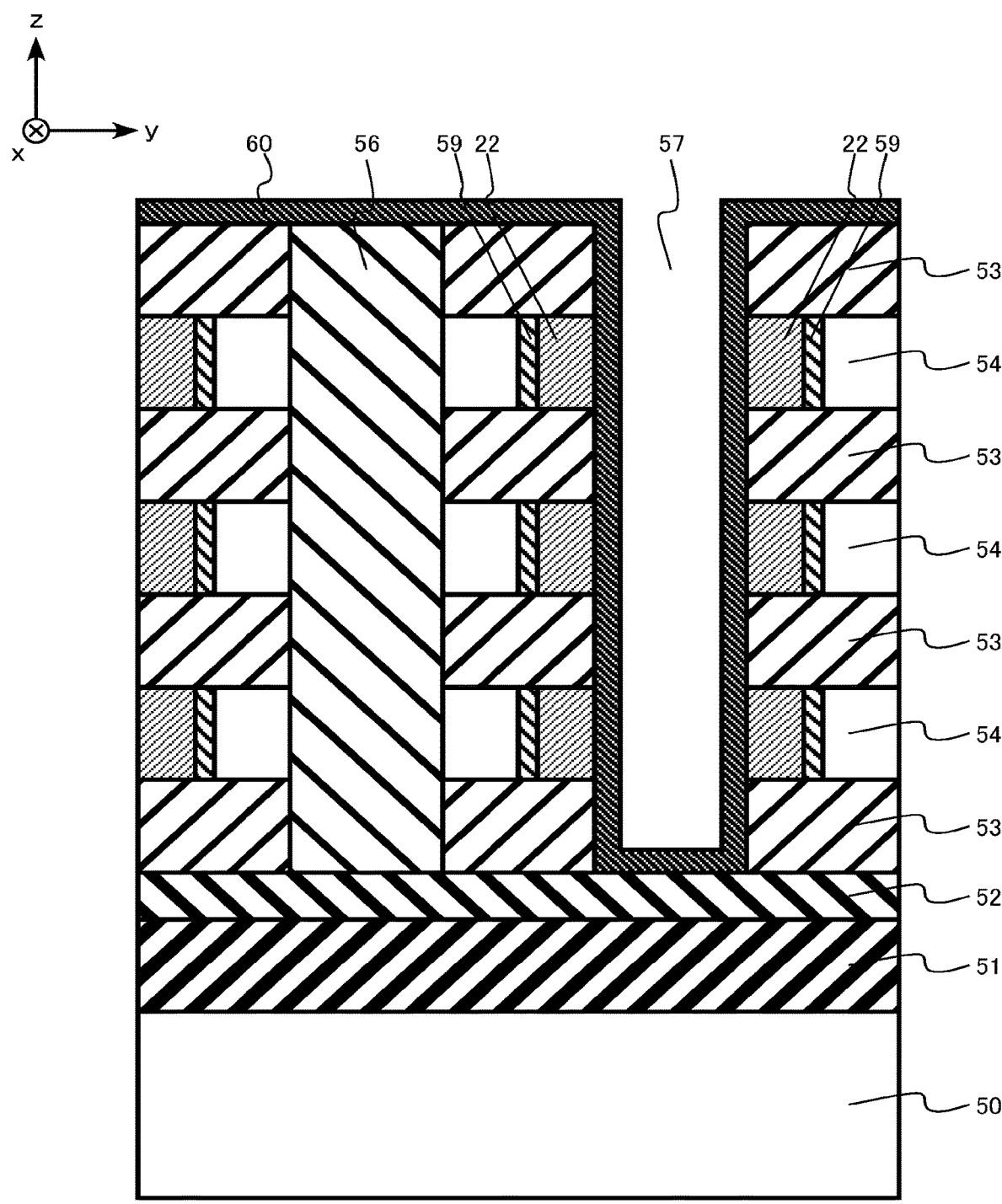
FIG. 13 is a schematic cross-sectional view of the method for manufacturing a semiconductor memory device according to the first embodiment.

Next, titanium films 60 are formed in the memory holes 57 (FIG. 13). The titanium films 60 are deposited by, for example, plasma CVD. For example, titanium tetrachloride gas ($TiCl_4$ gas) and hydrogen gas ($H_2$ gas) are used for forming the titanium films 60 by plasma CVD. The temperature during formation of the titanium films 60 is, for example, 600° C.

Figure 14:
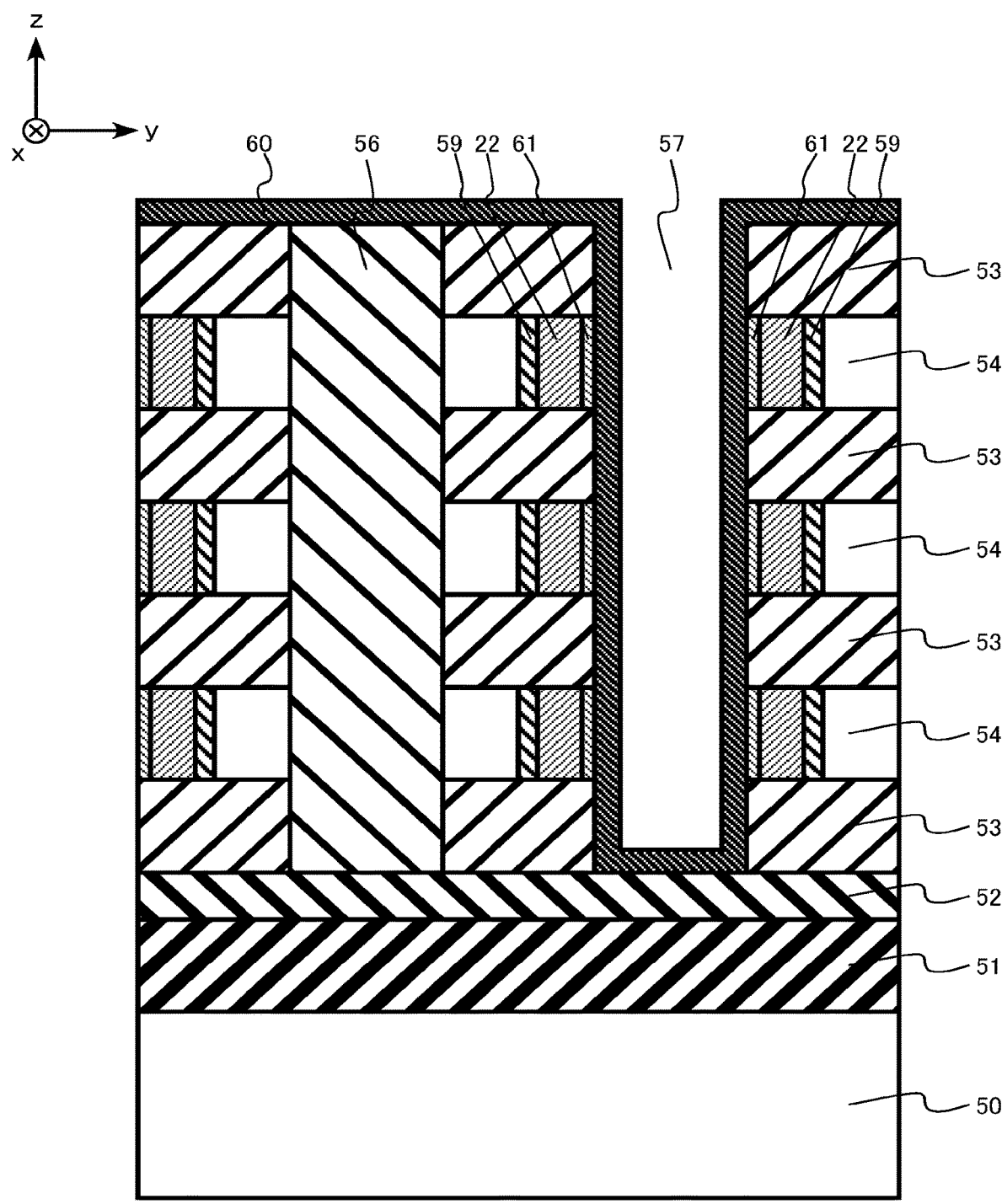
FIG. 14 is a schematic cross-sectional view of the method for manufacturing a semiconductor memory device according to the first embodiment.

Next, the polycrystalline silicon regions 22 and a part of the titanium films 60 are subjected to a silicide reaction to form titanium silicide films 61 (FIG. 14). The silicide reaction is generated, for example, by the heat during formation of the titanium films 60 by plasma CVD. For example, the titanium silicide films 61 are formed simultaneously with formation of the titanium films 60.

The titanium silicide films 61 have a thickness in y direction of, for example, 0.2 nm or more and 1 nm or less.

Figure 15:
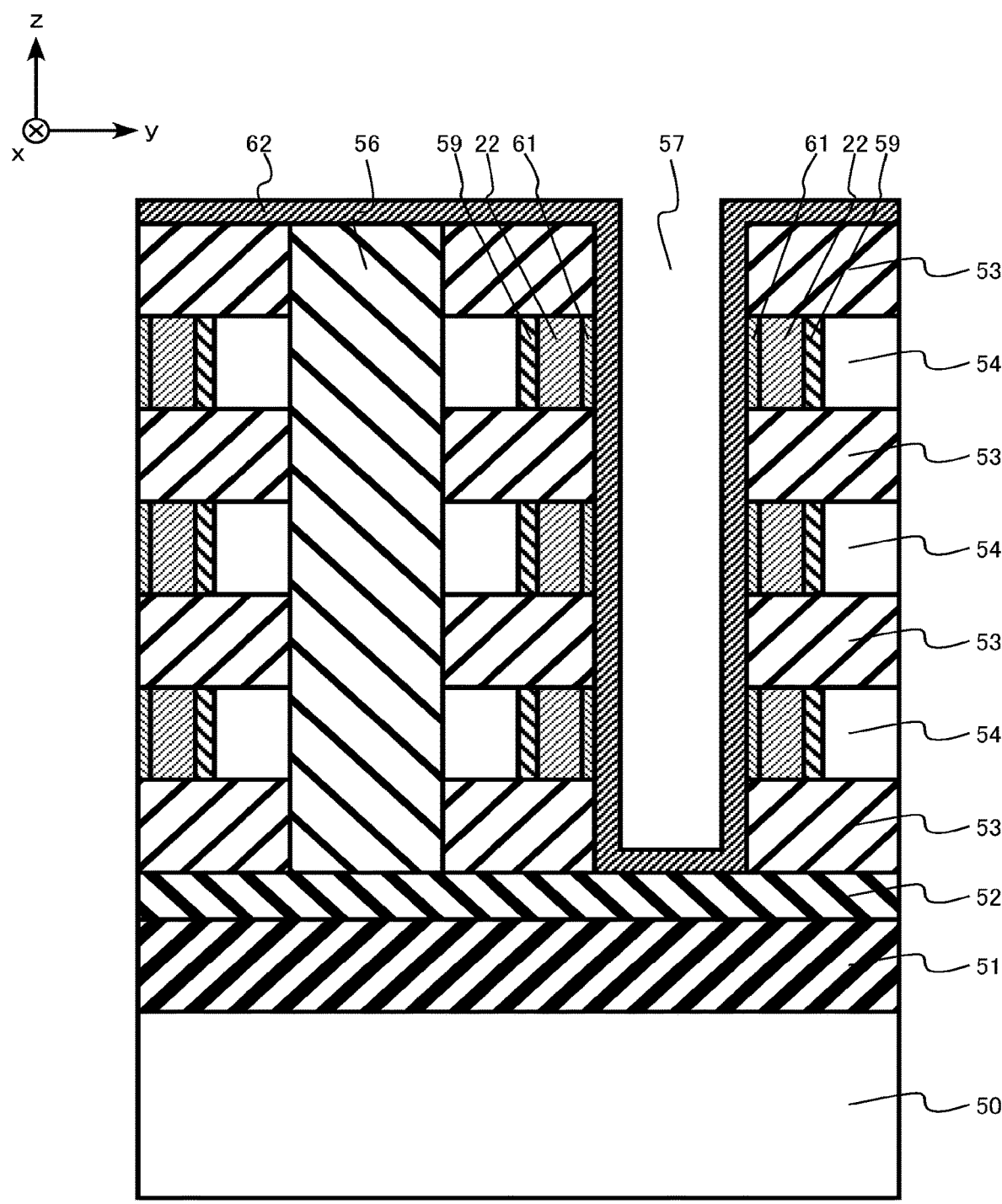
FIG. 15 is a schematic cross-sectional view of the method for manufacturing a semiconductor memory device of the first embodiment.

Next, the titanium films 60 remaining after the silicide reaction is nitrided to form titanium nitride films 62 (FIG. 15). The titanium films 60 are nitrided by, for example, plasma nitridation in an atmosphere containing ammonia gas ($NH_3$ gas).

After forming the titanium films 60, the titanium films 60 are nitrided, for example, while the titanium films 60 are not exposed to the atmosphere. The titanium films 60 are nitrided, for example, in the same chamber as the chamber used for forming the titanium films 60. Converting the titanium films 60 into the titanium nitride films 62 by the nitridation makes it possible to prevent, for example, corrosion of the metal films 24 and the gate electrode layers 28 due to residual chlorine at the time of forming the titanium films 60.

Figure 16:
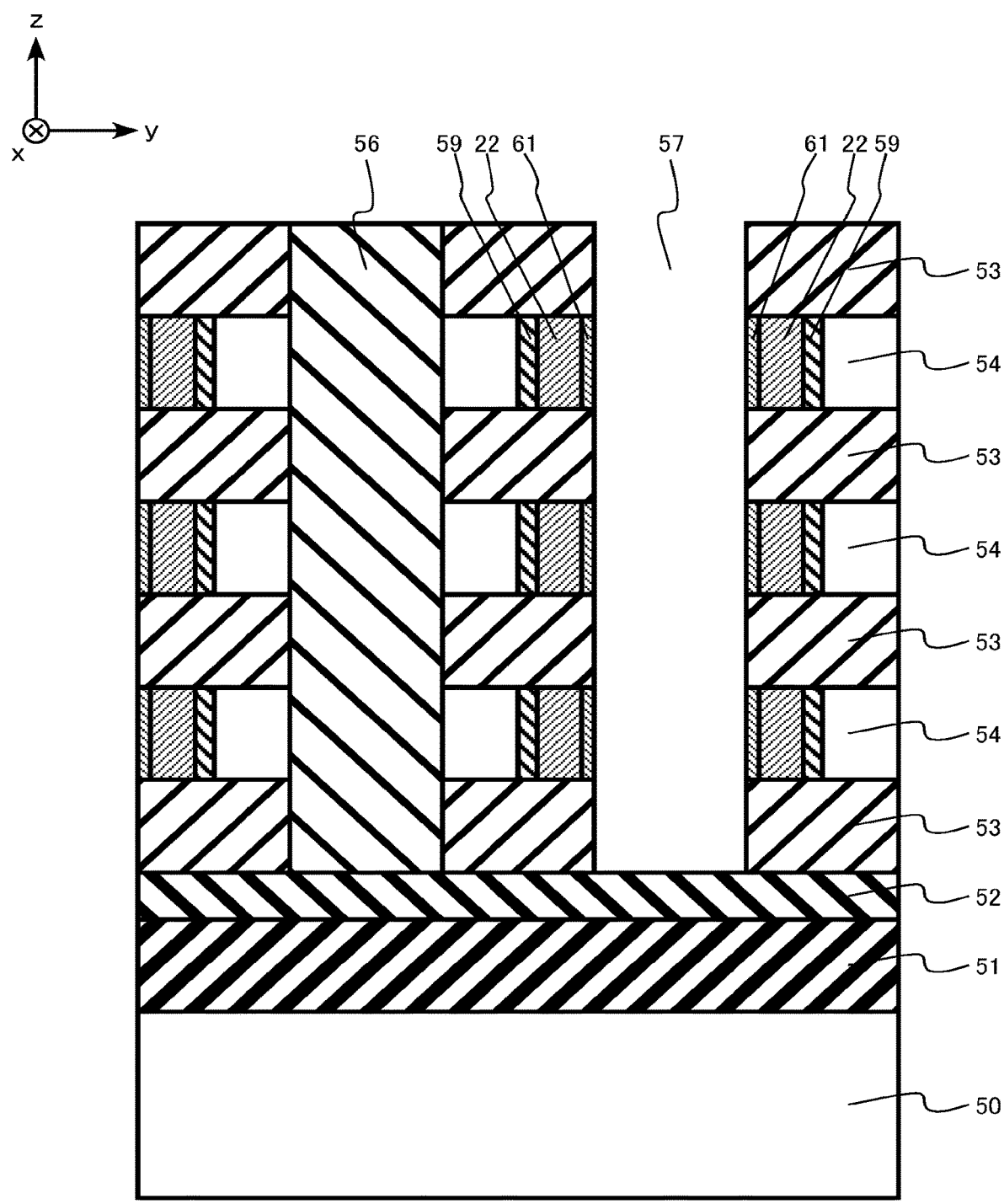
FIG. 16 is a schematic cross-sectional view of the method for manufacturing a semiconductor memory device according to the first embodiment.

Next, the titanium nitride films 62 are selectively removed to the titanium silicide films 61 (FIG. 16). The titanium nitride films 62 are removed by, for example, wet etching. The titanium silicide films 61 is selectively formed on the polycrystalline silicon regions 22.

Figure 17:
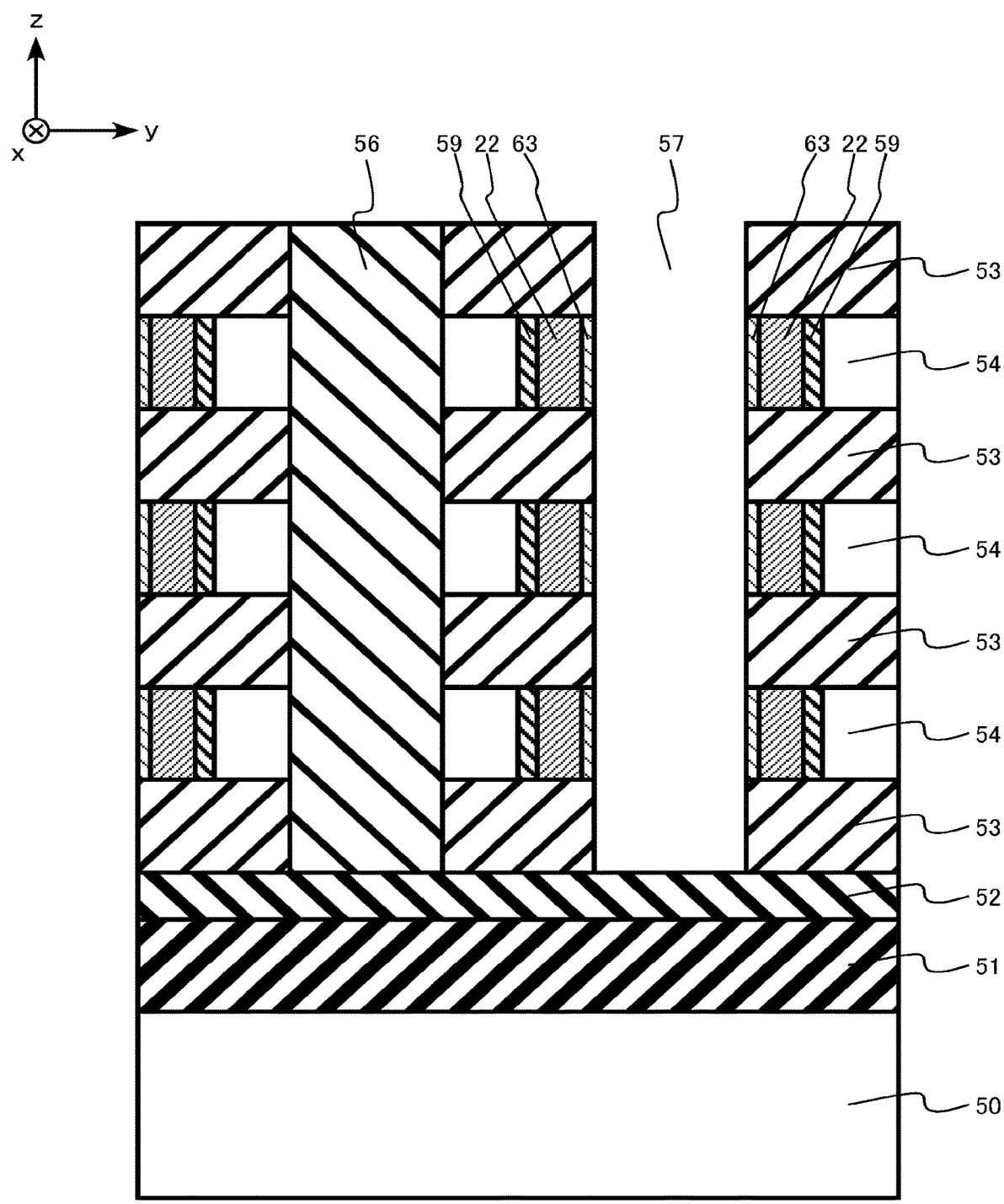
FIG. 17 is a schematic cross-sectional view of the method for manufacturing a semiconductor memory device according to the first embodiment.

Next, the titanium silicide films 61 are nitrided (FIG. 17). The nitridation forms nitrogen containing-titanium silicide films 63. The nitridation is performed by, for example, plasma nitriding in an atmosphere containing ammonia gas ($NH_3$ gas).

The nitrogen containing-titanium silicide films 63 have a thickness in y direction of, for example, 0.2 nm or more and 1 nm or less. Each nitrogen containing-titanium silicide film 63 is an example of the metal film. The nitrogen containing-titanium silicide films 63 eventually become the metal films 24.

Figure 18:
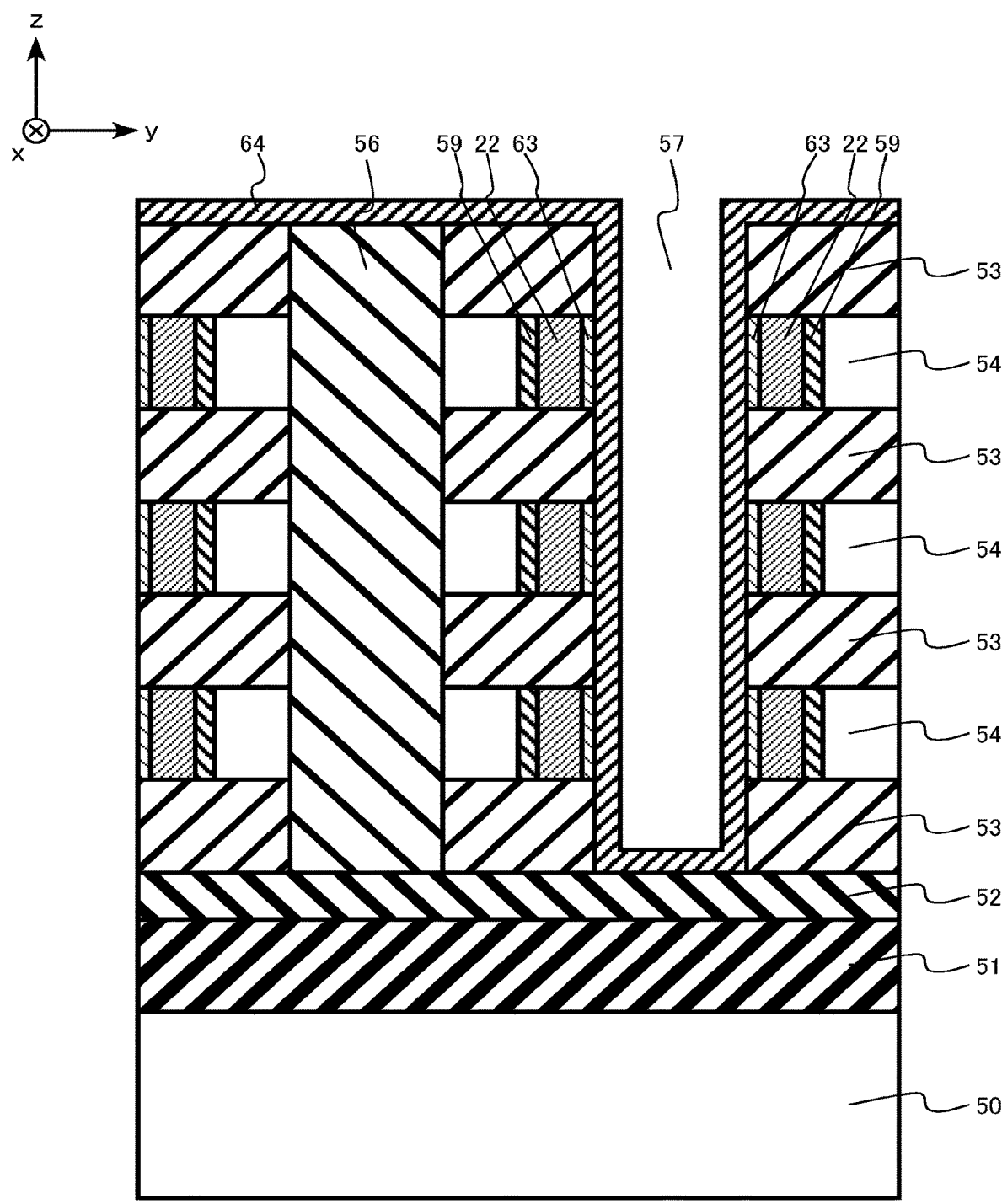
FIG. 18 is a schematic cross-sectional view of the method for manufacturing a semiconductor memory device according to the first embodiment.

Next, aluminum oxide films 64 are formed on the nitrogen containing-titanium silicide films 63 (FIG. 18). The aluminum oxide films 64 are formed in the memory holes 57. The aluminum oxide films 64 are deposited by, for example, atomic layer deposition (ALD). The aluminum oxide films 64 in the memory holes 57 have a thickness in y direction of, for example, 5 nm or more and 15 nm or less.

Each aluminum oxide film 64 is an example of the second insulating film. The aluminum oxide films 64 eventually become the block insulating films 26.

Then, for example, a titanium nitride film and a tungsten film are formed in each memory hole 57. The titanium nitride film eventually becomes the barrier metal layer 28a. The tungsten film eventually becomes the metal layer 28b. The barrier metal layer 28a and the metal layer 28b serve as the gate electrode layer 28.

The memory cell array of the flash memory 100 according to the first embodiment is manufactured by the aforementioned manufacturing method.

Hereinafter described are functions and effects of the semiconductor memory device according to the first embodiment.

A three-dimensional NAND flash memory with memory cells disposed three-dimensionally achieves a high integration degree and a low cost. Scaling down the memory cells of the 3D NAND flash memory enables further enhancement in integration degree.

The scaling-down of memory cells reduces an accumulation of charge in one memory cell. For example, in order to enhance read-out characteristics and charge retention characteristics of memory cells, it is desired to increase an accumulation of charge in one memory cell.

Each memory cell MC of the flash memory 100 according to the first embodiment includes the metal film 24 between the polycrystalline silicon region 22 and the block insulating film 26. In addition to the polycrystalline silicon region 22 that functions as the charge accumulation region, the memory cell MC is provided with the metal film 24 that functions as the charge accumulation region. Such a configuration increases an accumulation of charge in one memory cell as compared with a memory cell with no metal film 24. This enhances, for example, read-out characteristics and charge retention characteristics of the memory cell MC.

The metal film 24 preferably has a thickness in y direction (t3 in FIG. 3) smaller than that of the tunnel insulating film 20 (t1 in FIG. 3). Furthermore, the metal film 24 preferably has the y-direction thickness t3 of 1 nm or less.

Reducing the metal film 24 in y-direction thickness t3 prevents diffusion of metal elements contained in the metal film 24. Accordingly, it is possible to prevent characteristic degradation of the flash memory 100 due to the diffusion of the metal elements. This enhances the reliability of the flash memory 100.

In regard to a distance between the metal film 24 and the gate electrode layer 28 (d1 in FIGS. 3, 4, and 5) and a distance between the interlayer insulating layer 16 and the gate electrode layer 28 (d2 in FIGS. 3, 4, and 5), a difference between those distances is preferably smaller than the y-direction thickness t1 of the tunnel insulating film 20. Furthermore, the difference between the distance d1 from the metal film 24 to the gate electrode layer 28 and the distance d2 from the interlayer insulating layer 16 to the gate electrode layer 28 is preferably 3 nm or less.

For example, in the example shown in FIG. 4, reducing the difference between the distance d1 from the metal film 24 to the gate electrode layer 28 and the distance d2 from the interlayer insulating layer 16 to the gate electrode layer 28 keeps the y-direction thickness of the channel layer 18 thick. This increases the on-state current of the transistor of the memory cell MC.

For example, in the example shown in FIG. 4, reducing the difference between the distance d1 from the metal film 24 to the gate electrode layer 28 and the distance d2 from the interlayer insulating layer 16 to the gate electrode layer 28 decreases a distance between the channel layer 18 and the gate electrode layer 28. This makes it possible to prevent intercell interference between adjacent memory cells MC.

Furthermore, in the example shown in FIG. 4, reducing the distance between the channel layer 18 and the gate electrode layer 28 decreases the memory cell MC in width in y direction. This makes it possible to scale down the memory cell MC.

In the example shown in FIG. 5, reducing the difference between the distance d1 from the metal film 24 to the gate electrode layer 28 and the distance d2 from the interlayer insulating layer 16 to the gate electrode layer 28 prevents, for example, the block insulating film 26 from decreasing in thickness. This makes it possible to prevent an increase of leakage current between the metal film 24 and the gate electrode layer 28.

The metal film 24 preferably includes titanium (Ti) and silicon (Si). For example, in a case where the metal film 24 is a titanium silicide film, the memory cell MC enhances in heat resistance as compared with a case where the metal film 24 is, for example, a nickel silicide film or a cobalt silicide film.

Furthermore, the metal film 24 preferably includes titanium (Ti), silicon (Si), and nitrogen (N). For example, in a case were the metal film 24 is a titanium silicide film containing nitrogen (N), the memory cell MC enhances in heat resistance and oxidation resistance as compared with a case where the metal film 24 is, for example, a titanium silicide film without nitrogen (N).

In the method for manufacturing the flash memory 100 according to the first embodiment, the metal films 24 are formed by silicide reactions between the polycrystalline silicon regions 22 and the titanium films 60. Accordingly, it is possible to form the metal films 24 selectively on the polycrystalline silicon regions 22. This makes it possible to form the thin metal films 24 on the polycrystalline silicon regions 22 with good controllability.

In this manner, according to the first embodiment, a metal film is provided between a polycrystalline silicon region and a block insulating film, which enables a semiconductor memory device that increases an accumulation of charge in one memory cell.

Second Embodiment

A semiconductor memory device according to a second embodiment is different from the semiconductor memory device according to the first embodiment in that a silicon nitride film is provided between a metal film and a polycrystalline silicon region. Hereinafter, details that overlap with the first embodiment will be omitted.

Figure 19:
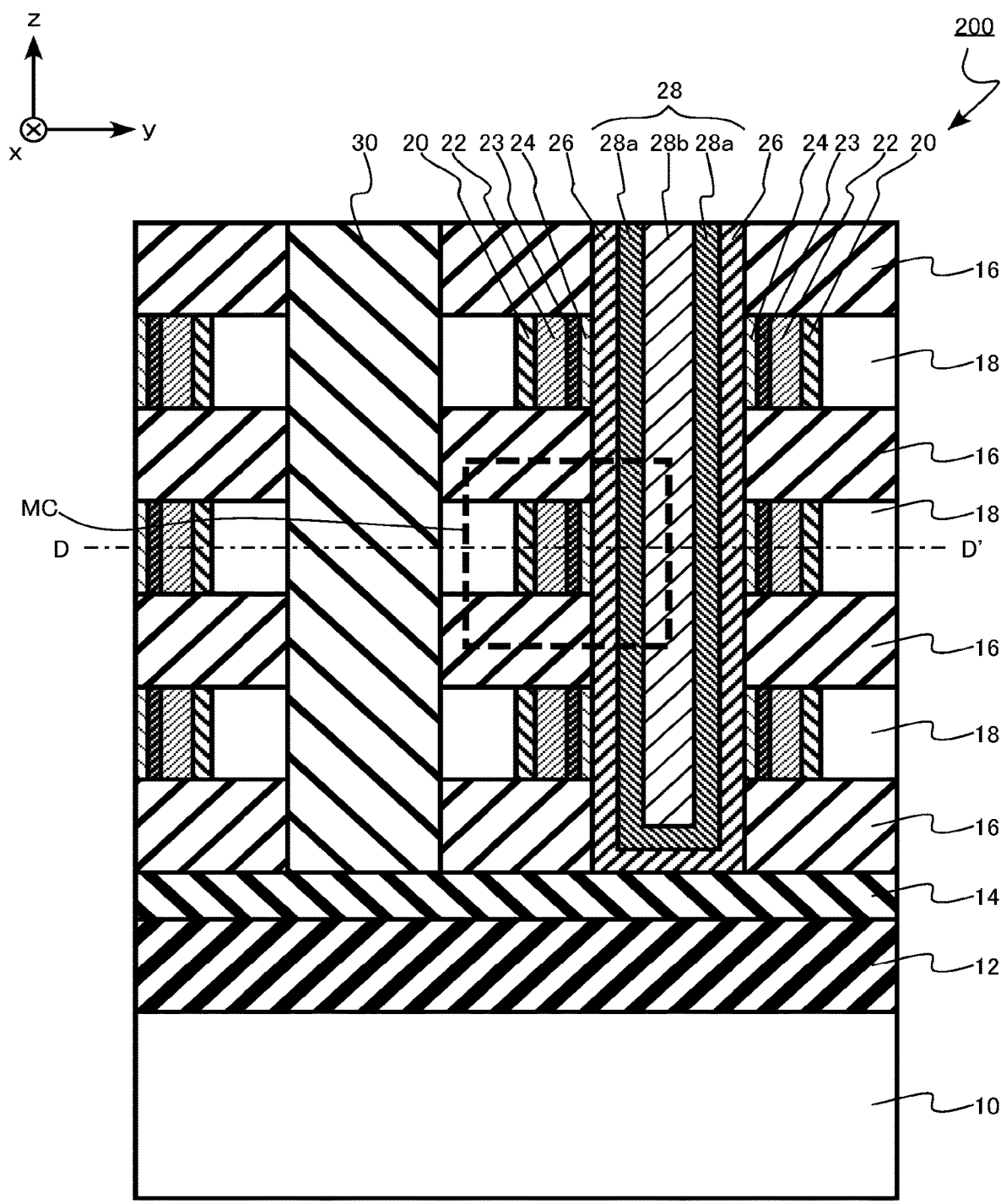
FIG. 19 is a schematic cross-sectional view of a semiconductor memory device according to a second embodiment.
Figure 20:
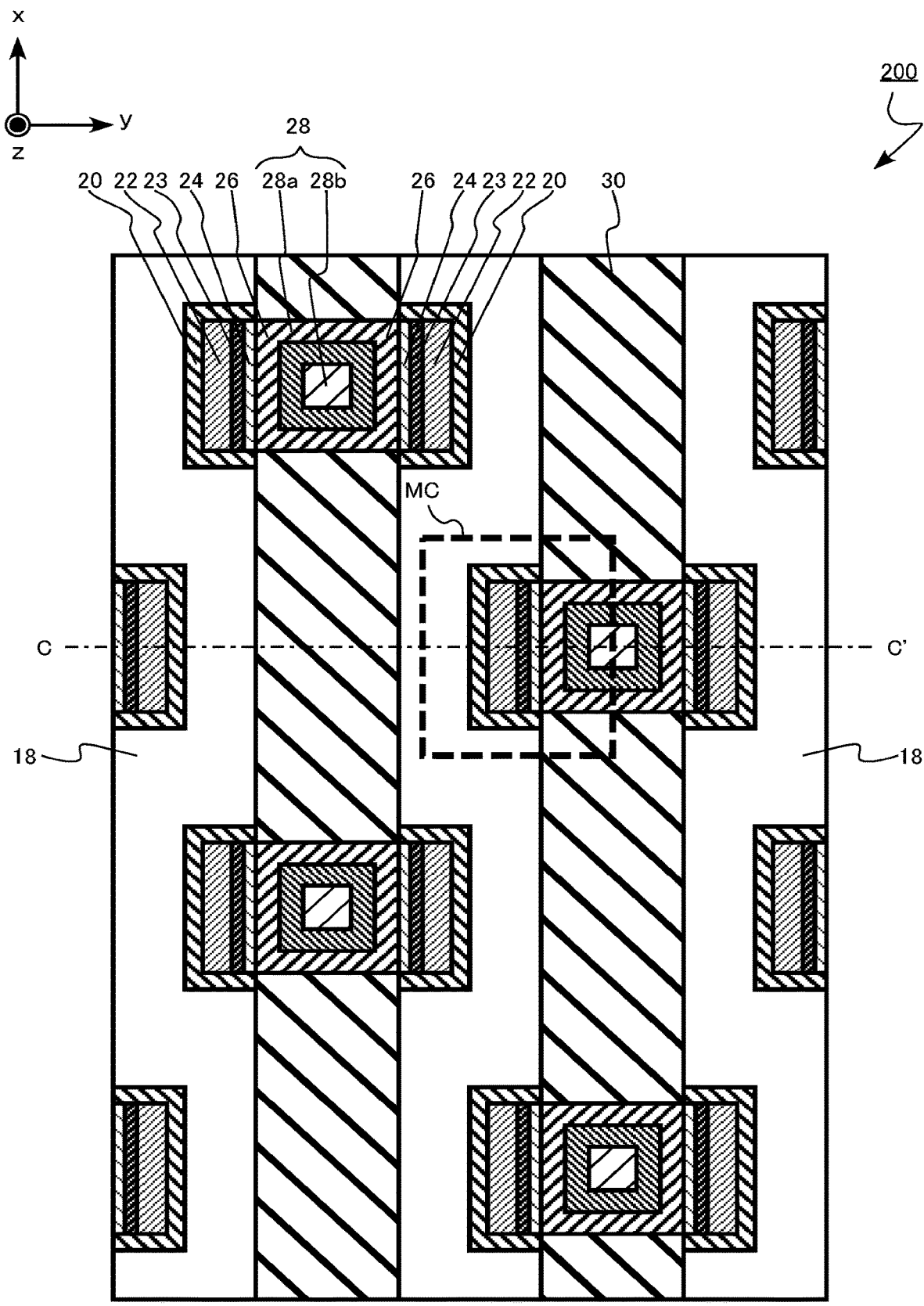
FIG. 20 is a schematic cross-sectional view of the semiconductor memory device according to the second embodiment.

FIGS. 19 and 20 are schematic cross-sectional views of the semiconductor memory device according to the second embodiment. FIGS. 19 and 20 are cross-sectional views illustrating a memory cell array of a flash memory 200 according to the second embodiment.

FIG. 19 is a cross section taken along line C-C' in FIG. 20. FIG. 20 is a cross section taken along line D-D' in FIG. 19. An area surrounded by dashed lines in each of FIGS. 19 and 20 corresponds to a memory cell MC.

FIG. 19 is a yz cross section of a memory cell array. FIG. 20 is an xy cross section of the memory cell array. Hereinafter, x direction is described as an example of the first direction. Y direction is described as an example of a second direction.

The flash memory 200 includes a semiconductor substrate 10, a substrate insulating layer 12, a stopper insulating layer 14, interlayer insulating layers 16, channel layers 18, tunnel insulating films 20, polycrystalline silicon regions 22, silicon nitride films 23, metal films 24, block insulating films 26, gate electrode layers 28, and trench insulating layers 30. Each gate electrode layer 28 includes a barrier metal layer 28a and a metal layer 28b.

Each metal film 24 is provided between each polycrystalline silicon region 22 and each gate electrode layer 28. Each metal film 24 is provided between each polycrystalline silicon region 22 and each block insulating film 26.

The metal films 24 have a function of accumulating electric charges. Each polycrystalline silicon region 22 and each metal film 24 function as charge accumulation regions of each memory cell MC.

Each metal film 24 includes, for example, a metal. Each metal film 24 includes, for example, tungsten (W). The metal films 24 are, for example, tungsten films.

Each metal film 24 includes, for example, tungsten (W) and nitrogen (N). The metal films 24 are, for example, tungsten nitride films.

Each metal film 24 includes, for example, tungsten (W), nitrogen (N), and silicon (Si). The metal films 24 are, for example, silicon (Si) containing-tungsten nitride films.

The metal films 24 have a thickness in y direction of, for example, 0.2 nm or more and 1 nm or less.

Each silicon nitride film 23 is provided between each polycrystalline silicon region 22 and each metal film 24. The silicon nitride films 23 have a function of preventing the diffusion of metal elements from the metal films 24 to the polycrystalline silicon regions 22.

The silicon nitride films 23 have a thickness in y direction of, for example, 0.2 nm or more and 1 nm or less.

Hereinafter described is an example of a method for manufacturing a semiconductor memory device according to the second embodiment.

The method for manufacturing a semiconductor memory device according to the second embodiment includes: forming the metal film including: forming a tungsten film selectively on the polycrystalline silicon region; and nitriding the tungsten film. After the forming of the metal film, a silicon nitride film is formed between the polycrystalline silicon region and the metal film.

FIGS. 21, 22, 23, 24, and 25 are schematic cross-sectional views of the method for manufacturing a semiconductor memory device according to the second embodiment. FIGS. 21 to 25 each illustrate a cross section corresponding to FIG.

19. FIGS. 21 to 25 each illustrate an example of a method for manufacturing the memory cell array of the flash memory 200.

The processes in this method until silicon oxide films 59 are formed on polycrystalline silicon layers 54 of recesses 58 are similar to the processes in the method for manufacturing a semiconductor memory device according to the first embodiment.

Figure 21:
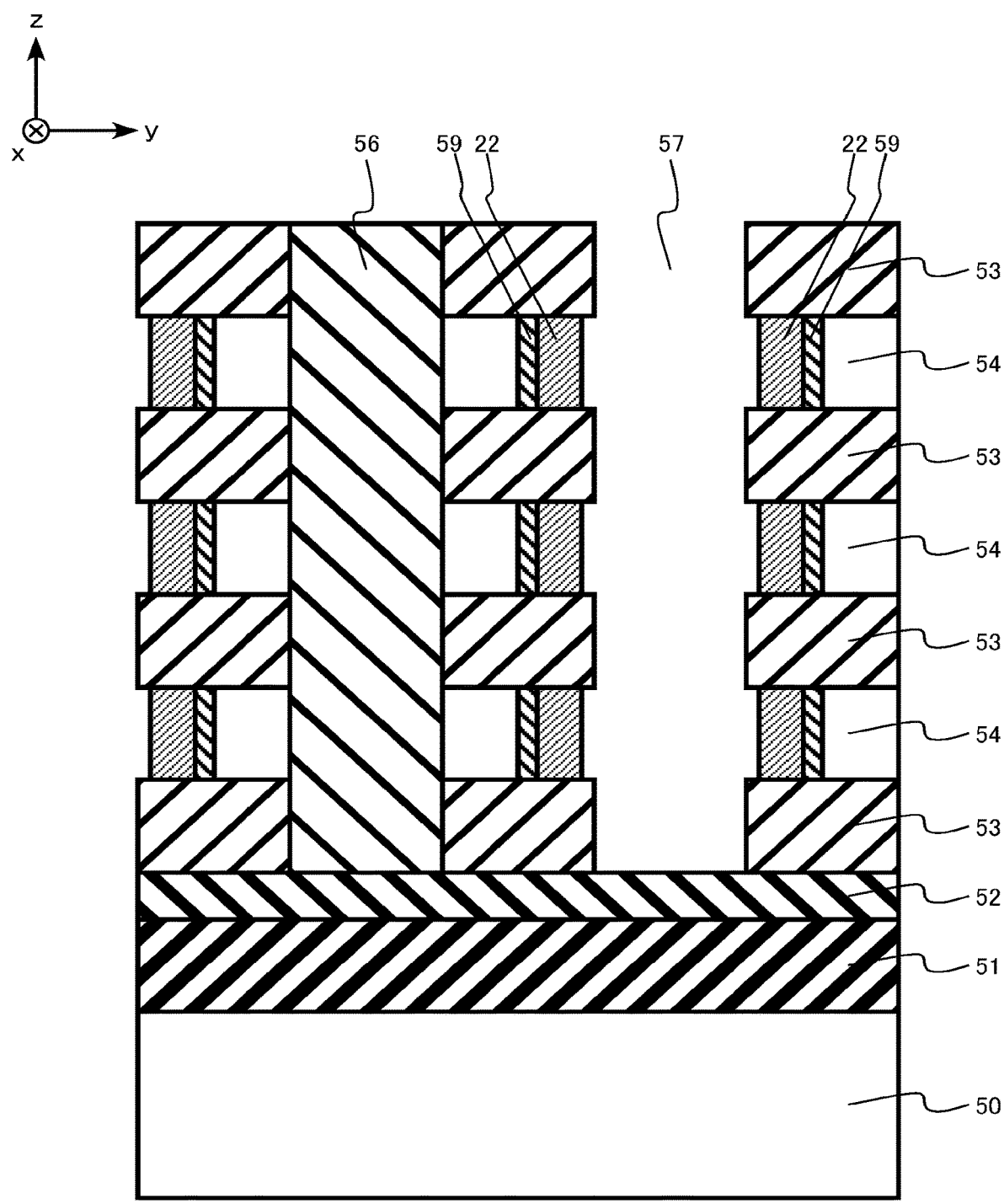
FIG. 21 is a schematic cross-sectional view of a method for manufacturing a semiconductor memory device according to the second embodiment.

Next, polycrystalline silicon regions 22 are formed on the silicon oxide films 59 of the recesses 58 (FIG. 21). When forming the polycrystalline silicon regions 22, for example, polycrystalline silicon films are deposited by CVD. Then, the polycrystalline silicon films on the silicon oxide layers 53 are removed by wet etching.

The polycrystalline silicon regions 22 have a thickness in y direction of, for example, 5 nm or more and 15 nm or less.

Figure 22:
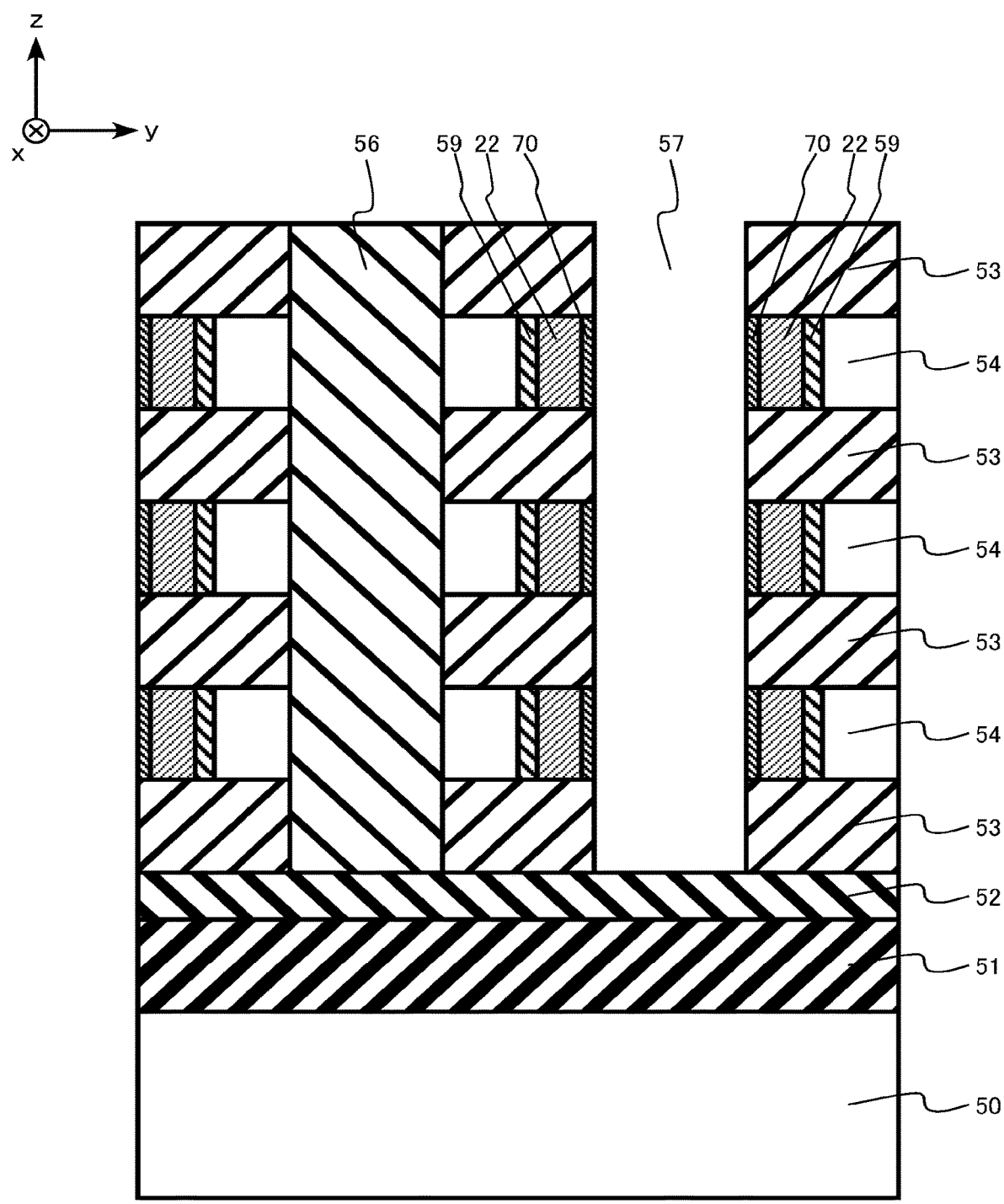
FIG. 22 is a schematic cross-sectional view of the method for manufacturing a semiconductor memory device according to the second embodiment.

Next, tungsten films 70 are selectively formed on the polycrystalline silicon regions 22 (FIG. 22). The tungsten films 70 are formed on the polycrystalline silicon regions 22 but not on the other regions such as the silicon oxide layers 53.

For example, the tungsten films 70 are formed by CVD using tungsten hexafluoride gas ($WF_6$ gas). The tungsten films 70 are formed on the polycrystalline silicon regions 22 by substitution reactions caused by formation of Si—F bonds. The tungsten films 70 are not formed, for example, on the silicon oxide layers 53 where substitution reactions do not occur.

The tungsten films 70 have a thickness in y direction of, for example, 0.2 nm or more and 1 nm or less.

Figure 23:
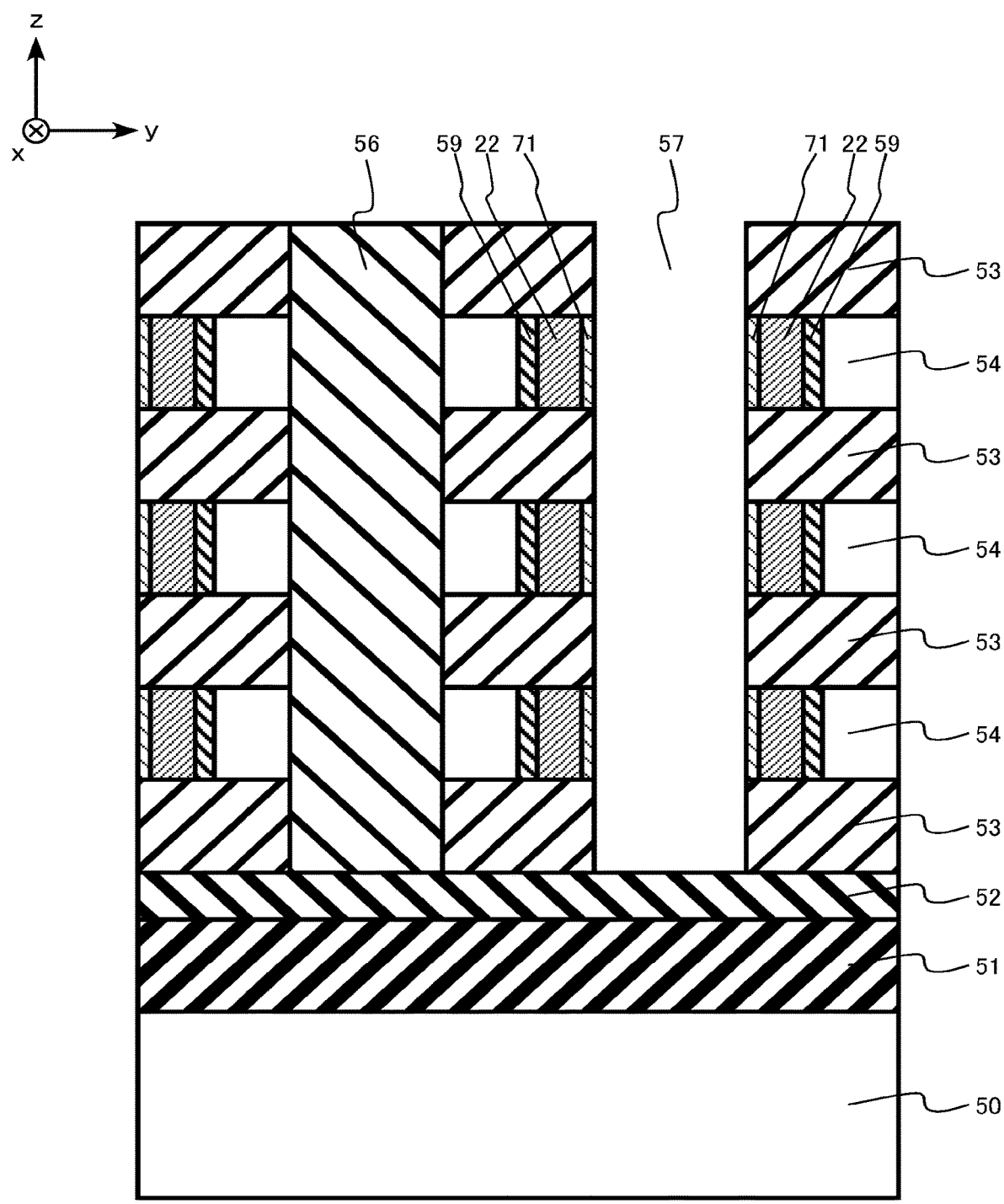
FIG. 23 is a schematic cross-sectional view of the method for manufacturing a semiconductor memory device according to the second embodiment.

Next, the tungsten films 70 are nitrided to form a tungsten nitride film 71 (FIG. 23). The tungsten films 70 are nitrided by, for example, plasma nitridation in an atmosphere containing ammonia gas ($NH_3$ gas).

Each tungsten nitride film 71 is an example of the metal film. The tungsten nitride films 71 eventually become the metal films 24.

Figure 24:
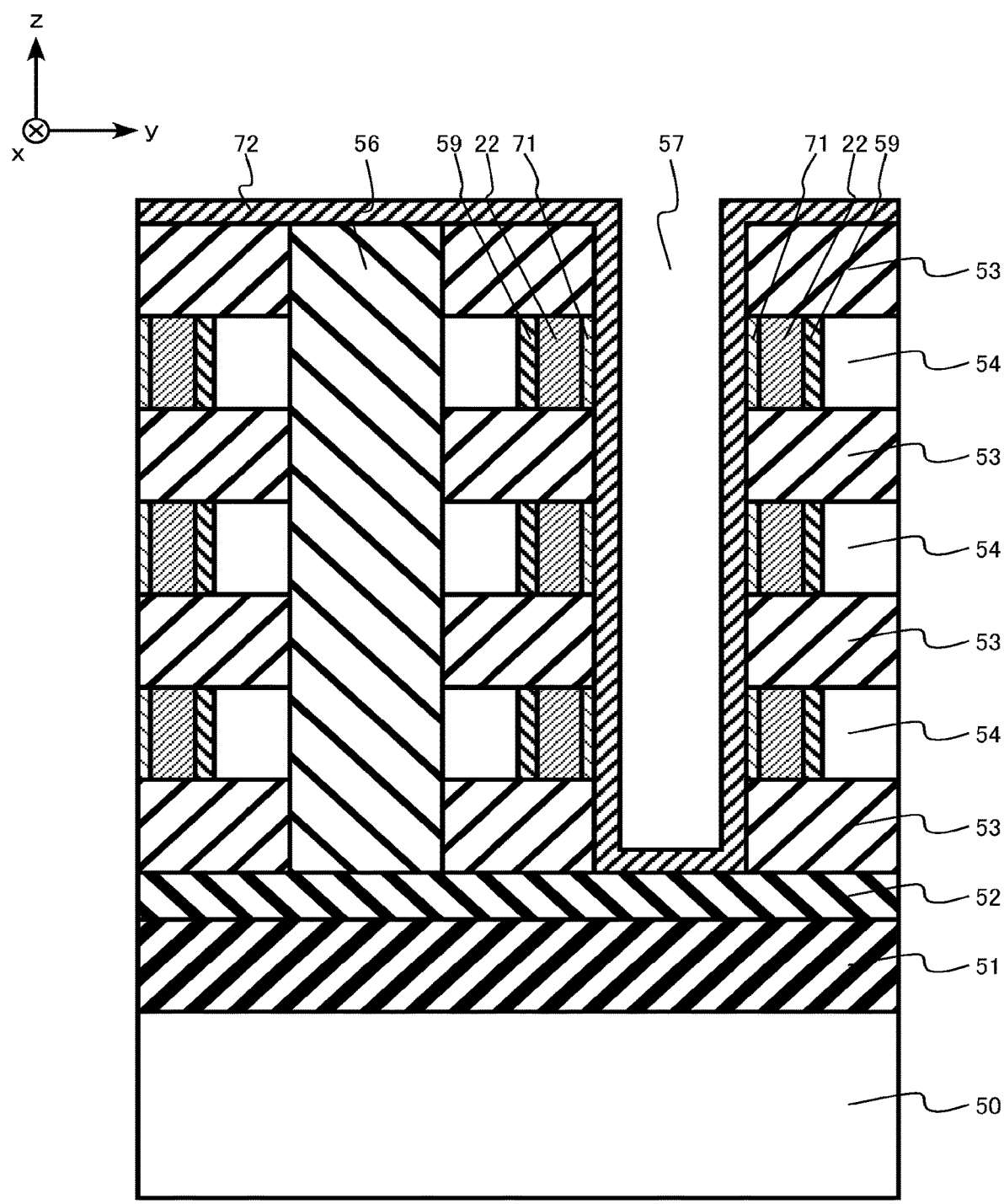
FIG. 24 is a schematic cross-sectional view of the method for manufacturing a semiconductor memory device according to the second embodiment.

Next, hafnium oxide films 72 are formed on the tungsten nitride films 71 (FIG. 24). The hafnium oxide films 72 are formed in memory holes 57. The hafnium oxide films 72 are deposited by, for example, ALD. The hafnium oxide films 72 in the memory holes 57 have a thickness in y direction of, for example, 5 nm or more and 15 nm or less.

Each hafnium oxide film 72 is an example of the second insulating film. The hafnium oxide films 72 eventually become the block insulating films 26.

Figure 25:
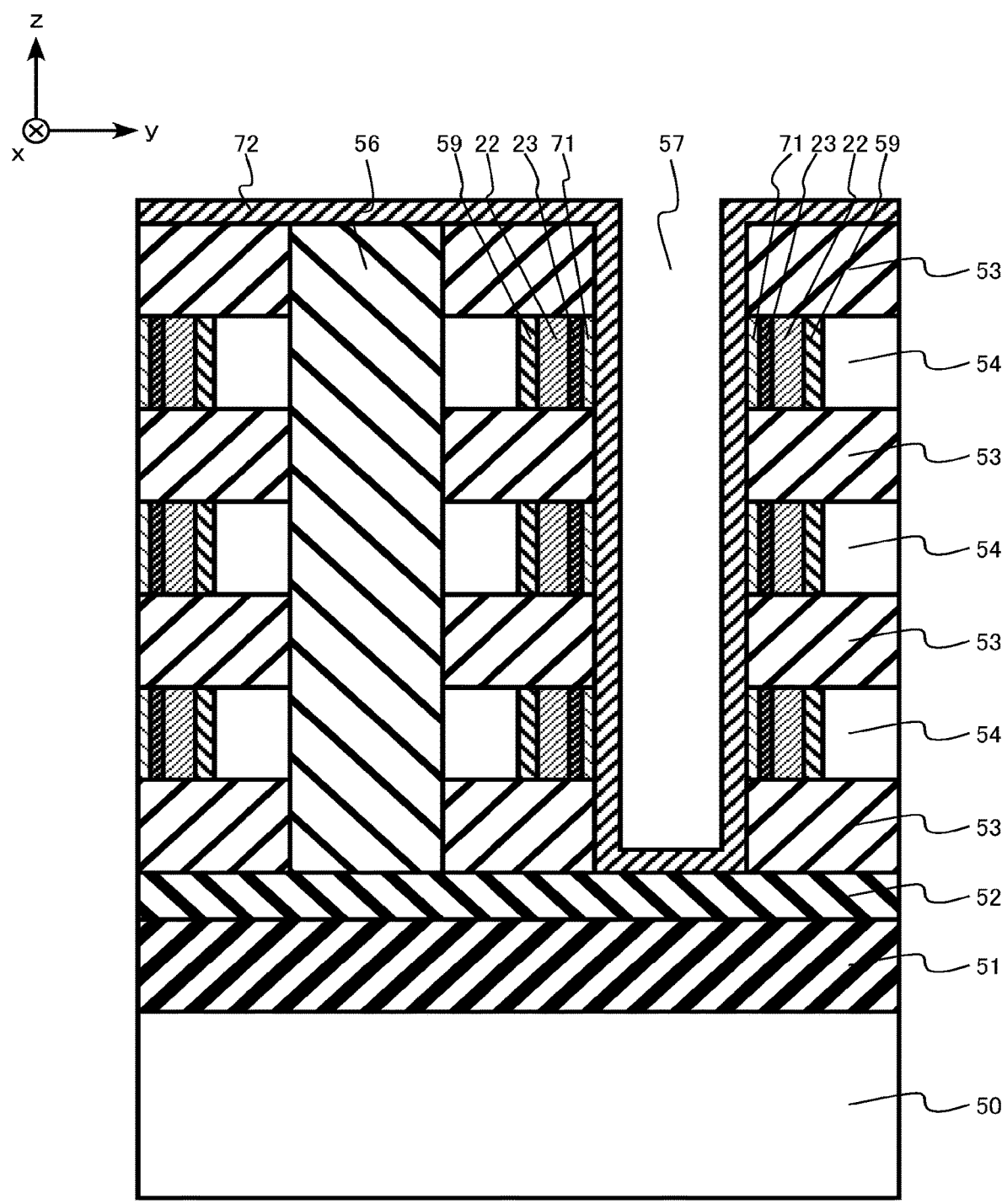
FIG. 25 is a schematic cross-sectional view of the method for manufacturing a semiconductor memory device according to the second embodiment.

Next, the silicon nitride films 23 are formed between the polycrystalline silicon regions 22 and the tungsten nitride films 71 (FIG. 25). The silicon nitride films 23 are formed, for example, by heat treatment in a non-oxidizing atmosphere. The heat treatment causes nitrogen to diffuse from the tungsten nitride films 71 to the polycrystalline silicon regions 22, whereby forming the silicon nitride films 23.

The heat treatment for forming the silicon nitride films 23 modifies and stabilizes the hafnium oxide films 72.

Then, for example, a titanium nitride film and a tungsten film are formed in each memory hole 57. The titanium nitride film eventually becomes the barrier metal layer 28a. The tungsten film eventually becomes the metal layer 28b. The barrier metal layer 28a and the metal layer 28b serve as the gate electrode layer 28.

The memory cell array of the flash memory 200 of the semiconductor memory device according to the second embodiment is manufactured by the aforementioned manufacturing method.

Each memory cell MC of the flash memory 200 according to the second embodiment includes the metal film 24 between the polycrystalline silicon region 22 and the block insulating film 26. As similar to the flash memory 100 according to the first embodiment, such a configuration increases an accumulation of charge in one memory cell as compared with a memory cell with no metal film 24. This enhances, for example, read-out characteristics and charge retention characteristics of the memory cell MC.

Furthermore, in each memory cell MC of the flash memory 200 according to the second embodiment, the silicon nitride film 23 is provided between the polycrystalline silicon region 22 and the metal film 24. The silicon nitride film 23 prevents the diffusion of metal elements from the metal film 24 to the polycrystalline silicon region 22. This enhances the reliability of the memory cell MC.

The metal film 24 preferably includes tungsten (W) and nitrogen (N). For example, in a case where the metal film 24 is a tungsten nitride film, the memory cell MC enhances in heat resistance as compared with a case where the metal film 24 is, for example, a tungsten film.

Furthermore, in the method for manufacturing the flash memory 200 according to the second embodiment, the metal films 24 are formed by selectively growing the tungsten films 70 on the polycrystalline silicon regions 22. Accordingly, it is possible to form the metal films 24 selectively on the polycrystalline silicon regions 22. This makes it possible to form the thin metal films 24 on the polycrystalline silicon regions 22 with good controllability.

In this manner, according to the second embodiment, as similar to the first embodiment, a metal film is provided between a polycrystalline silicon region and a block insulating film, which enables a semiconductor memory device that increases an accumulation of charge in one memory cell.

While certain embodiments have been described, these embodiments have been presented by way of example only, and are not intended to limit the scope of the inventions. Indeed, a semiconductor memory device and a manufacturing method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a semiconductor substrate;
a first insulating layer provided above the semiconductor substrate;
a second insulating layer, the first insulating layer interposed between the semiconductor substrate and the second insulating layer;
a semiconductor layer provided between the first insulating layer and the second insulating layer, the semiconductor layer extending in a first direction parallel to a surface of the semiconductor substrate;
a gate electrode layer extending in a direction perpendicular to the surface;
a first insulating film provided between the semiconductor layer and the gate electrode layer;
a second insulating film provided between the first insulating film and the gate electrode layer, between the first insulating layer and the gate electrode layer, and between the second insulating layer and the gate elec- trode layer, the second insulating film being in contact with the first insulating layer and the second insulating layer;

a polycrystalline silicon region provided between the first insulating film and the second insulating film; and a metal film provided between the polycrystalline silicon region and the second insulating film, the metal film containing titanium (Ti) and silicon (Si).

2. The semiconductor memory device according to claim 1, wherein the metal film has a thickness in a second direction smaller than a thickness of the first insulating film in the second direction, the second direction being parallel to the surface of the semiconductor substrate and perpendicular to the first direction.

3. The semiconductor memory device according to claim 2, wherein the metal film has a thickness of 1 nm or less in the second direction.

4. The semiconductor memory device according to claim 1, wherein the metal film includes nitrogen (N).

5. The semiconductor memory device according to claim 1, wherein a difference between a distance from the metal film to the gate electrode layer and a distance from the first insulating layer to the gate electrode layer is smaller than a thickness of the first insulating film in a second direction parallel to the surface of the semiconductor substrate and perpendicular to the first direction.

6. The semiconductor memory device according to claim 1, wherein a difference between a distance from the metal film to the gate electrode layer and a distance from the first insulating layer to the gate electrode layer is 3 nm or less.

7. The semiconductor memory device according to claim 1, wherein the second insulating film includes at least one metal element selected from the group consisting of hafnium (Hf), aluminum (Al), and zirconium (Zr).

8. A semiconductor memory device comprising:
a semiconductor substrate;
a first insulating layer provided above the semiconductor substrate;
a second insulating layer, the first insulating layer interposed between the semiconductor substrate and the second insulating layer;
a semiconductor layer provided between the first insulating layer and the second insulating layer, the semiconductor layer extending in a first direction parallel to a surface of the semiconductor substrate;
a gate electrode layer extending in a direction perpendicular to the surface;
a first insulating film provided between the semiconductor layer and the gate electrode layer;
a second insulating film provided between the first insulating film and the gate electrode layer, between the first insulating layer and the gate electrode layer, and between the second insulating layer and the gate electrode layer, the second insulating film being in contact with the first insulating layer and the second insulating layer;
a polycrystalline silicon region provided between the first insulating film and the second insulating film; and
a metal film provided between the polycrystalline silicon region and the second insulating film, the metal film containing tungsten (W) and nitrogen (N).

9. The semiconductor memory device according to claim 8, wherein the metal film has a thickness in a second direction smaller than a thickness of the first insulating film in the second direction, the second direction being parallel to the surface of the semiconductor substrate and perpendicular to the first direction.

10. The semiconductor memory device according to claim 9, wherein the metal film has a thickness of 1 nm or less in the second direction.

11. The semiconductor memory device according to claim 8, further comprising a silicon nitride film provided between the metal film and the polycrystalline silicon region.

12. The semiconductor memory device according to claim 8, wherein a difference between a distance from the metal film to the gate electrode layer and a distance from the first insulating layer to the gate electrode layer is smaller than a thickness of the first insulating film in a second direction parallel to the surface of the semiconductor substrate and perpendicular to the first direction.

13. The semiconductor memory device according to claim 8, wherein a difference between a distance from the metal film to the gate electrode layer and a distance from the first insulating layer to the gate electrode layer is 3 nm or less.

14. The semiconductor memory device according to claim 8, wherein the second insulating film includes at least one metal element selected from the group consisting of hafnium (Hf), aluminum (Al), and zirconium (Zr).

* * * * *